United States Patent
Kandimalla et al.

(10) Patent No.: US 12,445,141 B2
(45) Date of Patent: Oct. 14, 2025

(54) VOLTAGE-TO-DELAY CONVERTER

(71) Applicant: Texas Instruments Incorporated, Dallas, TX (US)

(72) Inventors: Sai Vikas Kandimalla, Nalgonda (IN); Neeraj Shrivastava, Bangalore (IN); Visvesvaraya Appala Pentakota, Bangalore (IN); Keshav Tiwari, New Delhi (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 18/498,358

(22) Filed: Oct. 31, 2023

(65) Prior Publication Data
US 2025/0141460 A1   May 1, 2025

(51) Int. Cl.
*H03M 1/12*   (2006.01)
*G04F 10/00*   (2006.01)

(52) U.S. Cl.
CPC ............. *H03M 1/12* (2013.01); *G04F 10/005* (2013.01)

(58) Field of Classification Search
CPC .... H03M 1/12; H03M 1/0612; H03M 1/0614; G04F 10/00; G04F 10/005
See application file for complete search history.

(56) References Cited

U.S. PATENT DOCUMENTS

| | | | | |
|---|---|---|---|---|
| 3,541,446 A | * | 11/1970 | Prozeller | H03M 1/00 324/130 |
| 3,784,922 A | * | 1/1974 | Blahut | H03M 3/024 341/143 |
| 3,882,484 A | * | 5/1975 | Brokaw | H03M 1/40 341/138 |
| 4,023,160 A | * | 5/1977 | Kirschner | H03M 1/406 341/158 |
| 4,039,950 A | * | 8/1977 | Glasbergen | H03F 3/72 375/249 |
| 4,318,086 A | * | 3/1982 | Peek | H03M 1/0854 341/156 |

(Continued)

OTHER PUBLICATIONS

U.S. Appl. No. 18/174,187, filed Feb. 24, 2023, "Calibration in Non-Linear Multi-Stage Delay-to-Digital Conversion Circuits."

(Continued)

*Primary Examiner* — Lam T Mai
(74) *Attorney, Agent, or Firm* — Mandy Barsilai Fernandez; Frank D. Cimino

(57) ABSTRACT

A voltage-to-delay converter includes a first reset transistor having a first terminal coupled to a power supply terminal, a gate terminal receiving a reset signal, and a second terminal coupled to a top plate of a first integrating capacitor, and a second reset transistor having a first terminal coupled to a power supply terminal, a gate terminal receiving the reset signal, and a second terminal coupled to a top plate of a second integrating capacitor. First and second input transistors receive first and second input voltages, and are coupled between the top plate of the first and second integrating capacitors, respectively, and a first current source. A discharge current source is coupled to bottom plates of the first and second integrating capacitors. A pulse generator has first and second inputs coupled to the top plate of the first and second integrating capacitors, respectively.

20 Claims, 12 Drawing Sheets

(56) References Cited

U.S. PATENT DOCUMENTS

| | | | | |
|---|---|---|---|---|
| 4,766,328 | A * | 8/1988 | Yang | H03K 3/0231 |
| | | | | 307/106 |
| 5,870,051 | A * | 2/1999 | Warburton | G01T 1/171 |
| | | | | 341/143 |
| 7,106,239 | B1 * | 9/2006 | Keskin | G04F 10/005 |
| | | | | 341/157 |
| 7,279,924 | B1 * | 10/2007 | Shumarayev | H03K 19/01707 |
| | | | | 327/280 |
| 7,595,616 | B2 * | 9/2009 | Prexl | H02M 3/1588 |
| | | | | 323/280 |
| 9,312,844 | B2 | 4/2016 | Darmawaskita | H03K 6/04 |
| 10,284,188 | B1 | 5/2019 | Soundararajan et al. | |
| 10,454,435 | B2 | 10/2019 | Liu | |
| 10,673,453 | B1 | 6/2020 | Pentakota et al. | |
| 10,673,456 | B1 * | 6/2020 | Dusad | H03M 1/206 |
| 10,778,243 | B2 | 9/2020 | Pentakota et al. | |
| 11,309,903 | B1 | 4/2022 | Miglani et al. | |
| 11,316,525 | B1 * | 4/2022 | Pentakota | H03M 1/109 |
| 11,316,526 | B1 * | 4/2022 | Rajagopal | H03M 1/502 |
| 11,387,840 | B1 | 7/2022 | Miglani et al. | |
| 11,438,001 | B2 | 9/2022 | Rajagopa et al. | |
| 11,569,837 | B1 | 1/2023 | Akhavan et al. | |
| 11,716,089 | B1 | 8/2023 | Verbruggen et al. | |
| 12,155,300 | B2 * | 11/2024 | Hunter | H03K 19/1737 |
| 2010/0066582 | A1 * | 3/2010 | Park | G04F 10/105 |
| | | | | 341/158 |
| 2010/0328130 | A1 * | 12/2010 | Bulzacchelli | H03M 1/20 |
| | | | | 341/166 |
| 2011/0163808 | A1 * | 7/2011 | Kumar | H03F 3/45179 |
| | | | | 330/296 |
| 2012/0056766 | A1 * | 3/2012 | Kiran | H03M 1/0612 |
| | | | | 341/110 |
| 2012/0062402 | A1 * | 3/2012 | Payne | H03M 1/0872 |
| | | | | 341/126 |
| 2014/0035696 | A1 * | 2/2014 | Ali | H04L 25/0278 |
| | | | | 333/32 |
| 2014/0132236 | A1 * | 5/2014 | Darmawaskita | H02M 3/156 |
| | | | | 323/283 |
| 2018/0183394 | A1 | 6/2018 | Liu | |
| 2019/0258281 | A1 * | 8/2019 | Ates | G05F 1/56 |
| 2020/0007085 | A1 | 1/2020 | Hsieh et al. | |
| 2020/0259502 | A1 * | 8/2020 | Dusad | H03M 1/502 |
| 2021/0184683 | A1 * | 6/2021 | Nam | H02M 3/158 |
| 2022/0200620 | A1 * | 6/2022 | Miglani | H03M 1/204 |
| 2022/0224349 | A1 | 7/2022 | Varshney et al. | |
| 2022/0247420 | A1 * | 8/2022 | Rajagopal | H03M 1/0836 |
| 2022/0247421 | A1 | 8/2022 | Pentakota et al. | |
| 2022/0271764 | A1 * | 8/2022 | K | H03M 1/002 |
| 2024/0072820 | A1 * | 2/2024 | Nurani | H03M 1/502 |
| 2024/0311624 | A1 * | 9/2024 | Wei | G06N 3/065 |

OTHER PUBLICATIONS

Hosticka, "Dynamic CMOS Amplifiers," vol. SC-15, No. 5, J. Sol. State Circ. (IEEE, 1980).

Liu Chun-Cheng et al: "28.1 A 0.46mW 5MHz BW79.7dB-SNDR noise-shaping SAR ADC with dynamic-amplifier-based FIR-IIR filter", (Feb. 5, 2017), pp. 466-467, XP033073628.

Lyu Yifan et al: "A 4-GS/s 39.9-dB SNDR 11.7-mW Hybrid Voltage-Time Two Step ADC with Feed-Forward Ring Oscillator-Based TDCs", (Sep. 23, 2019), pp. 163-166, XP033660797.

Zhao Yutong et at: A 400-MS/s 12-bit Voltage-Time Hybrid ADC with a Ping-Pong SAR TDC for Speed Enhancement., (May 21, 2023), pp. 1-5, XP034381139.

* cited by examiner

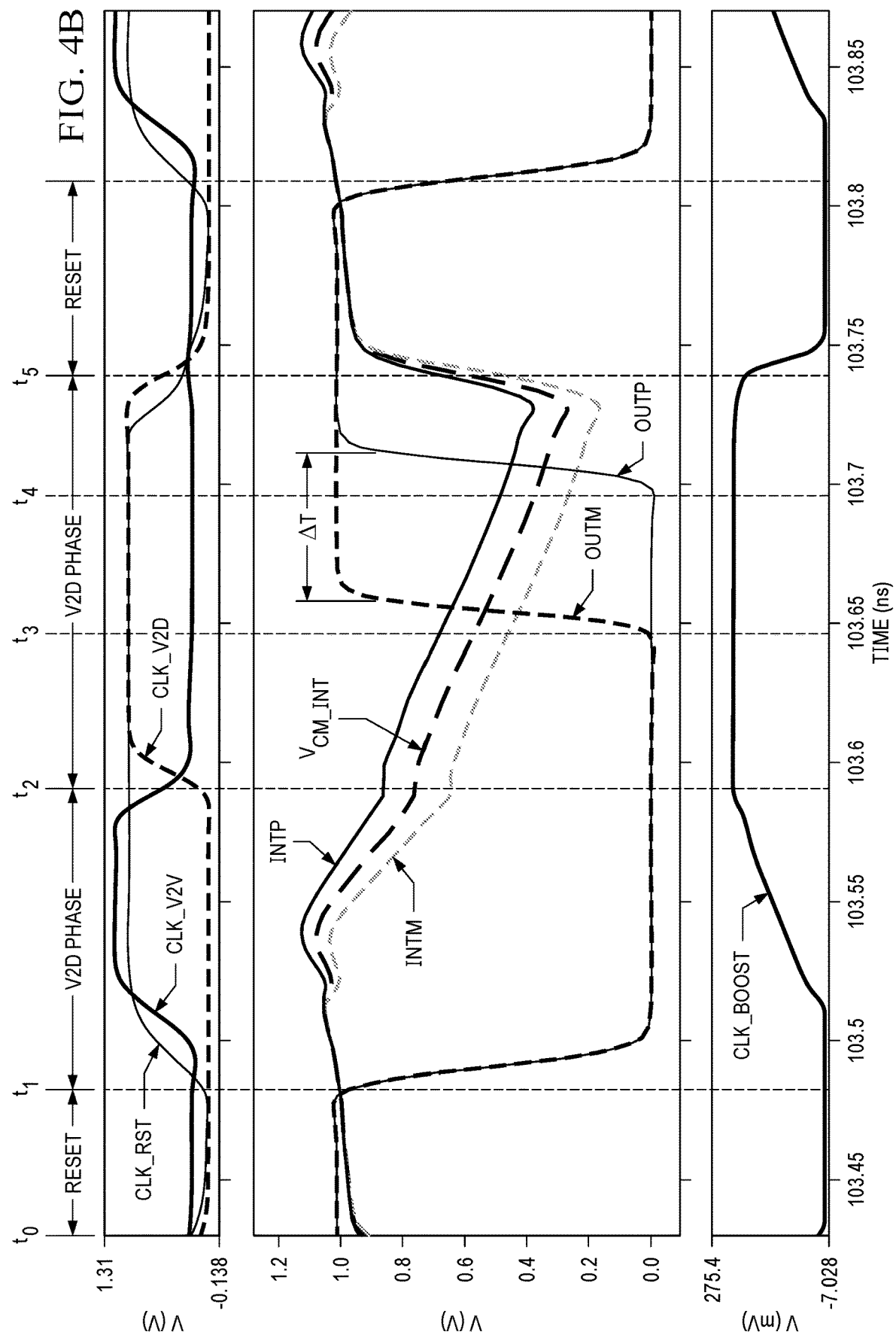

VOLTAGE-TO-DELAY CONVERTER

BACKGROUND

This specification relates to data conversion circuitry, more particularly to delay domain analog-to-digital converters.

Advances in the technology of wireless communications have enabled widespread deployment and new applications for such communications in recent years. Wireless communications are now commonplace in short-range communications (e.g., "personal area networks"), in wireless premises networks (e.g., home or office "WiFi" networks), and in longer-range communications (e.g., cellular networks). The performance requirements across these network types may range from low data rate and latency-tolerant applications to high data rate, real-time applications at gigahertz frequencies.

In any of these wireless communications applications, the conversion of analog signal levels to digital data and vice versa is an important function carried out at each network node or device. The performance requirements for high data rate communications devices, particularly in mobile and battery-powered devices such as user equipment capable of "5G" cellular communications, are reflected in the performance requirements for data conversion circuitry in those devices. In these applications (especially for mobile devices), data converters may need to provide high performance (e.g., low error rate) conversion at high data rates, over wide input bandwidths, yet at low power consumption levels. Power constraints on data converters are particularly stringent in multiple-in-multiple-out (MIMO) network devices, which commonly include integrated transceivers with as many as eight or sixteen transmitters and receivers (e.g., 8T8R, 16T16R).

ADCs operating in the "delay domain" have been proposed for high performance applications. An example delay domain ADC includes a voltage-to-delay (V2D) converter that operates to convert an input voltage level to a delay between two pulses. A time-to-digital converter (TDC) encodes the delay interval output from the V2D converter into a digital output word.

FIG. 1A illustrates prior art dynamic differential amplifier 100, which receives a differential input voltage at input terminals INP, INM and presents a differential output voltage at output terminals INTP, INTM. In one leg of dynamic amplifier 100, integrating capacitor 106P has a top plate coupled to output terminal INTP and a bottom plate at a common potential (e.g., circuit ground). N-channel metal-oxide-semiconductor (NMOS) transistor 104P has a drain coupled to the top plate of integrating capacitor 106P, and a gate receiving clock signal CLK_V2V. The source of NMOS transistor 104P is coupled to the drain of NMOS input transistor 102P at node VP, and also to the drain of p-channel MOS (PMOS) transistor 105P. PMOS transistor 105P has a source coupled to power supply voltage $V_{dd}$ and a gate receiving signal CLK_BIAS. NMOS input transistor 102P has a gate coupled to input terminal INP and a source coupled to tail node T. A second leg of dynamic amplifier 100 is similarly constructed, with integrating capacitor 106M having a top plate coupled to output terminal INTM and a bottom plate at circuit ground. NMOS transistor 104M has a drain coupled to the top plate of integrating capacitor 106M, a gate receiving clock signal CLK_V2V, and a source coupled at node VM to the drain of NMOS input transistor 102M and the drain of PMOS transistor 105M. PMOS transistor 105M has a source coupled to power supply voltage $V_{dd}$ and a gate receiving signal CLK_BIAS. NMOS input transistor 102M has a gate coupled to input terminal INM and a source coupled to tail node T.

Tail node T is coupled to the drain of NMOS transistor 109. NMOS transistor 109 has a gate receiving signal CLK_BIAS and a source coupled to the drain of NMOS transistor 110. NMOS transistor 110 has a drain coupled to the source of NMOS transistor 109, a gate receiving signal NBIAS_V2V, and a source at circuit ground.

Dynamic amplifier 100 operates by initially precharging integrating capacitors 106P, 106M to a selected voltage (e.g., power supply voltage $V_{dd}$). A differential input voltage at input terminals INP, INM differentially turns on input transistors 102P, 102M, discharging integrating capacitors 102P, 102M toward ground at a relative rate corresponding to the input differential voltage, developing a differential voltage at output terminals INTP, INTM.

SUMMARY

According to an example, a voltage-to-delay converter includes a first reset transistor having a first terminal coupled to a power supply terminal, a gate terminal receiving a reset signal, and a second terminal coupled to a top plate of a first integrating capacitor, and a second reset transistor having a first terminal coupled to a power supply terminal, a gate terminal receiving the reset signal, and a second terminal coupled to a top plate of a second integrating capacitor. First and second input transistors have gates coupled to receive first and second input voltages, first terminals coupled to the top plate of the first and second integrating capacitors, respectively, and second terminals coupled to a first current source. A discharge current source is coupled to bottom plates of the first and second integrating capacitors. A pulse generator has first and second inputs coupled to the top plate of the first and second integrating capacitors, respectively.

According to another example, an analog-to-digital conversion method includes charging a first plate of each of first and second integrating capacitors to a first voltage; applying a differential voltage across the gate terminals of first and second transistors coupled between the first plates of the first and second integrating capacitors, respectively, discharging second plates of each of the first and second integrating capacitors, generating first and second pulses having a relative delay corresponding to voltages at the first plates of the first and second integrating capacitors, and generating a digital output word corresponding to the relative delay of the first and second pulses.

According to another example, an analog-to-digital converter includes a voltage-to-delay converter and a delay-to-digital converter. The voltage-to-delay converter includes a first reset transistor having a first terminal coupled to a power supply terminal, a gate terminal receiving a reset signal, and a second terminal coupled to a top plate of a first integrating capacitor, and a second reset transistor having a first terminal coupled to a power supply terminal, a gate terminal receiving the reset signal, and a second terminal coupled to a top plate of a second integrating capacitor. First and second input transistors have gates coupled to receive first and second input voltages, first terminals coupled to the top plate of the first and second integrating capacitors, respectively, and second terminals coupled to a first current source. A discharge current source is coupled to bottom plates of the first and second integrating capacitors. A pulse generator has first and second inputs coupled to the top plate of the first and second integrating capacitors, respectively. The delay-to-digital converter has first and second inputs coupled to the first and second outputs of the pulse generator, respectively, and having a digital output, and is configured to generate a digital output word corresponding to a relative delay between pulses at the first and second outputs of the pulse generator.

Example technical advantages enabled by one or more of these examples include providing a delay-domain analog-to-digital converter with improved noise performance, reduced sensitivity to input transistor mismatches, and improved current source headroom that maintains transistors in saturation. Improved linearity in the conversion can be provided through calibration of the gain characteristic of a current discharge stage to cancel non-linearity in the input stage, providing good linearity over variations in process, voltage, and temperature.

Other technical advantages enabled by the disclosed examples will be apparent to those of ordinary skill in the art having reference to the following specification together with its drawings.

BRIEF DESCRIPTION OF THE DRAWINGS

FIG. 4B is a timing diagram illustrating the operation of an example of the dynamic amplifier and constant current discharge circuit of FIG. 4A.

The same reference numbers or other reference designators are used in the drawings to illustrate the same or similar (in function and/or structure) features.

DETAILED DESCRIPTION

Figure 2:
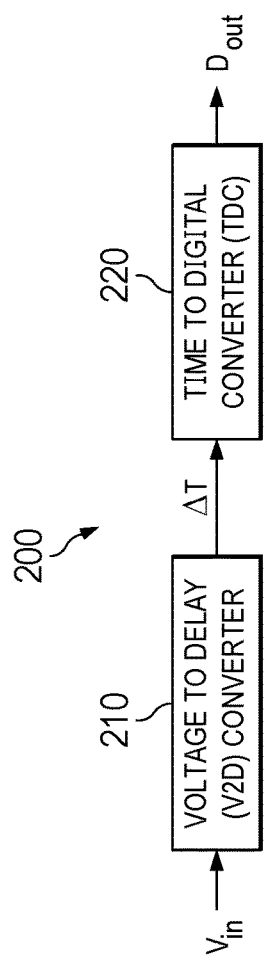
FIG. 2 is an electrical diagram, in block form, of an example analog-to-digital converter (ADC).

FIG. 2 illustrates the high-level architecture of an example delay domain analog-to-digital converter (ADC) 200. ADC 200 includes voltage-to-delay (V2D) converter 210 and time-to-digital converter (TDC) 220.

V2D converter 210 has an input receiving an input voltage $V_{in}$. Input voltage $V_{in}$ may be a single-ended or differential voltage, from which ADC 200 generates a digital output word $D_{out}$. For example, input voltage $V_{in}$ may be a sample acquired from a received communications signal by a sample-and-hold circuit operating at a selected sample rate. V2D converter 210 in this example generates a delay domain signal $\Delta T$ corresponding to the amplitude of input voltage $V_{in}$. For example, delay domain signal $\Delta T$ may be output by V2D converter 210 in the form of one or more conductor pairs that each communicate a pair of pulses with a relative delay $\Delta T$ corresponding to the amplitude of input voltage $V_{in}$.

TDC 220 has inputs receiving delay domain signal $\Delta T$ on the one or more conductor pairs from V2D converter 210. TDC 220 includes analog circuitry, digital logic, or a combination thereof arranged to produce digital output word $D_{out}$ at an output. For example, TDC 220 may have serial or parallel outputs, presenting the m bits of digital output word $D_{out}$ for each converted sample of input voltage $V_{in}$. Digital output word $D_{out}$ may be output synchronously with an associated system clock, for communication to downstream processing circuitry (not shown) suitable for the particular application.

Examples of TDC converter architectures suitable for use as TDC 220 in this example are described in U.S. Pat. Nos. 10,673,453; 10,778,243; 11,316,525; 11,387,840; and 11,316,526; U.S. Patent Application Publication Nos. US 2022/0247420; US 2022/0247421; and US 2022/0224349; and pending U.S. patent application Ser. No. 18/174,187, filed Feb. 24, 2023, each commonly assigned with this application and each incorporated by reference herein in its entirety.

Linearity of the output amplitude of an ADC with variations in input amplitude is an important factor in the accuracy and performance of ADC converters. Variation in the input voltage step width associated with each output code word value is referred to as differential non-linearity (DNL) error. Excessive DNL error can result in missing output code values over the full scale range of the ADC. Integral nonlinearity (INL) error expresses deviation of the ADC transfer function from a straight line over the full scale range.

In implementing a delay domain ADC, use of a dynamic differential amplifier in the V2D converter stage is attractive because dynamic amplifier operation facilitates the generation of delayed pulses from a differential input voltage. In addition, the gain from the dynamic amplifier effectively relaxes the noise specifications of the delay domain ADC. However, significant non-linearity is exhibited by some dynamic amplifiers, such as prior art dynamic amplifier 100 of FIG. 1A.

Figure 1A:
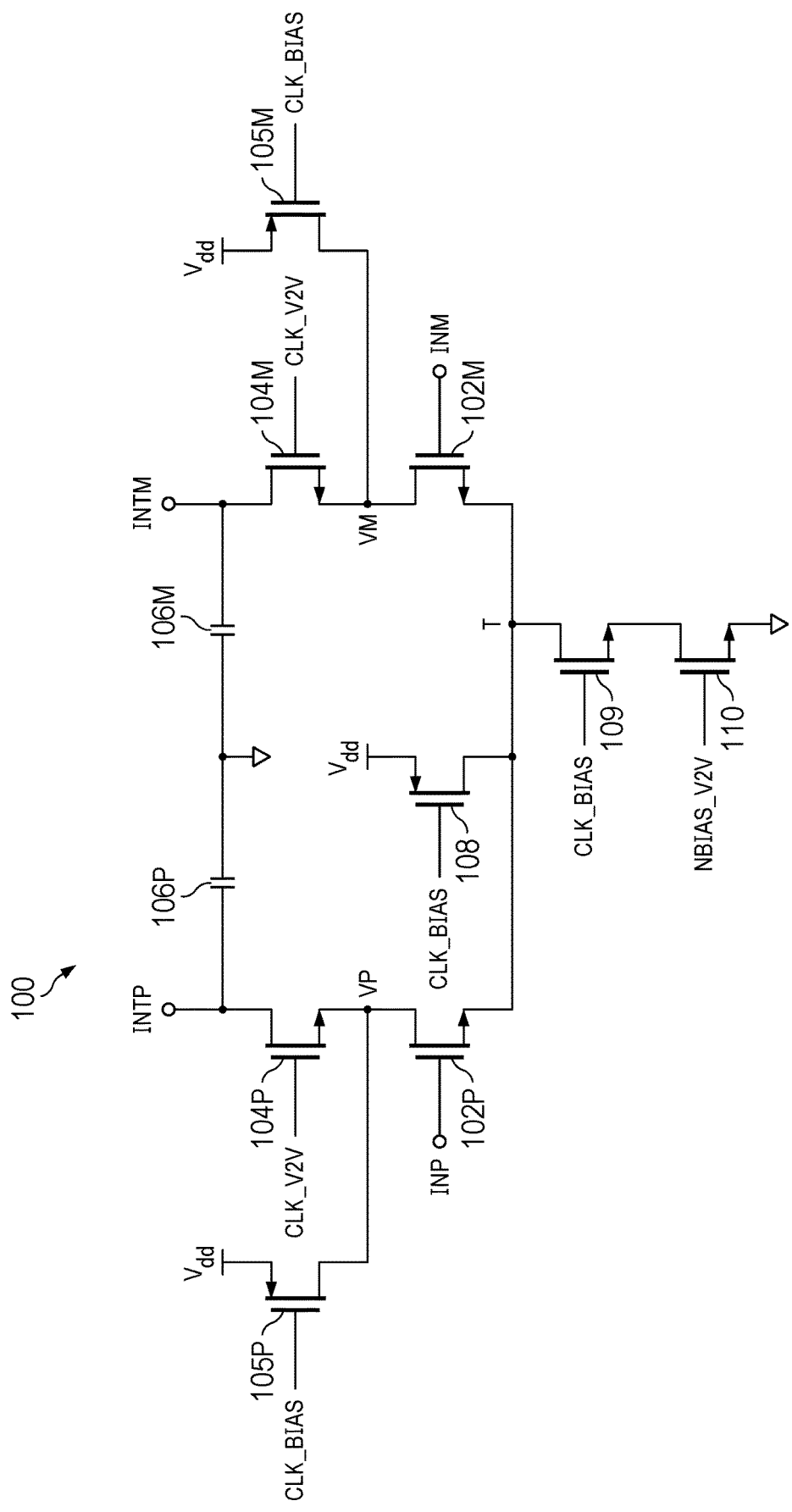
FIG. 1A is an electrical diagram, in schematic form, of a prior art dynamic amplifier.
Figure 1B:
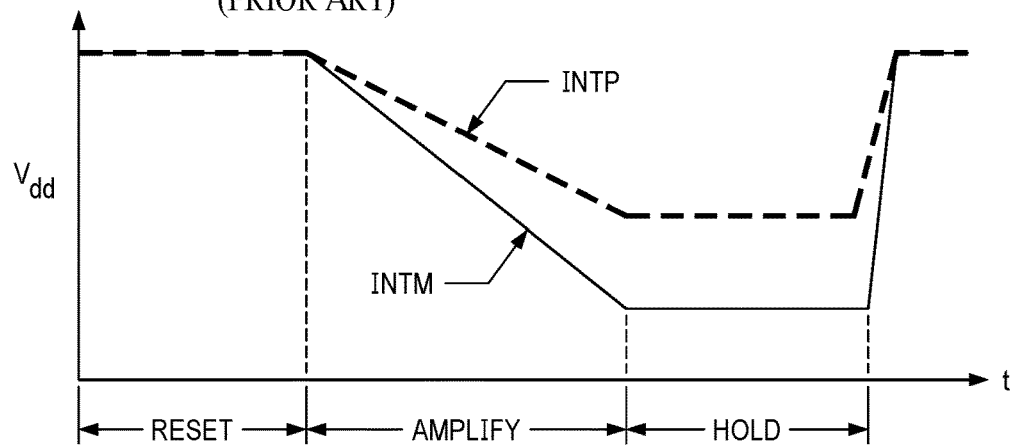
FIG. 1B is a timing diagram illustrating the operation of the dynamic amplifier of FIG. 1A.

In this regard, FIG. 1B illustrates an example operating cycle of prior art dynamic amplifier 100 of FIG. 1A. This operating cycle includes a reset phase in which integrating capacitors 106P and 106M are precharged to a selected voltage, such as near power supply voltage $V_{dd}$. In this reset phase, transistors 105P, 105M, and 108 are turned on by gate signal CLK_BIAS being at a low level, and transistors 104P, 104M and 109 are turned off by gate signals CLK_BIAS and CLK_V2V being at a low level. As a result, nodes VP, VM, and T are at or near power supply voltage $V_{dd}$, and the top plates of capacitors 106P and 106M are charged to at or near power supply voltage $V_{dd}$. This reset phase results in output nodes INTP, INTM being charged to a level at or near power supply voltage $V_{dd}$ as shown in FIG. 1B.

Following the precharge of integrated capacitors 106P and 106M in the reset phase, a differential voltage at input terminals INP, INM is sensed in an amplify phase of the operating cycle. This amplify phase is initiated by signal CLK_BIAS making a low-to-high transition, turning on NMOS transistor 109 and turning off PMOS transistors 105P, 105M, and 108. Transistors 104P, 104M are turned on during the amplify phase, allowing the differential gate voltages applied at inputs INP, INM in this amplify phase to determine the relative rates at which integrating capacitors 106P, 106M are discharged through input transistors 102P, 102M, respectively. NMOS transistor 110 operates as a current source, controlling the sum of the discharge currents according to gate voltage NBIAS_V2V. In the example of FIG. 1B, a negative differential voltage (e.g., the voltage at input INP differentially lower than that at input INM) results in integrating capacitor 106M discharging faster through input transistor 102M relative to integrating capacitor 106P. As integrating capacitors 106P, 106M discharge in this amplify phase, the voltage at output node INTP remains differentially higher than that at output node INTM.

In a hold phase following the amplify phase, transistors 104P, 104M are turned off by a high-to-low transition of signal CLK_V2V. Output nodes INTP, INTM are thus isolated from their corresponding input transistors 102P, 102M, stopping the discharge of integrating capacitors 106P, 106M. The differential output voltage across output nodes INTP, INTM at the end of the amplify phase is thus held for an interval, allowing downstream circuitry to respond, for example by generating a pair of pulses with a relative delay corresponding to the differential voltage at output nodes INTP, INTM. Dynamic amplifier 100 may then be reset for the next operating cycle.

A first order expression for gain G of dynamic amplifier 100 can be expressed as:

$$G = \frac{g_m T_{int}}{C} \quad (1)$$

where $g_m$ is the input transistor transconductance, $T_{int}$ is the discharge time constant of the integrating capacitors, and C is the capacitance of the integrating capacitors. As evident from this equation (1), gain G is independent of input voltage $V_{in}$, and, as such, good linearity is possible so long as the transistors in dynamic amplifier 100 are in saturation. Also, linearity in the operation of dynamic amplifiers tends to be limited by the transistor drain-to-source voltage ($V_{ds}$) margins for maintaining device saturation, especially at the low power supply voltages (e.g., nominal $V_{dd}$ of 1.0V) now common in high performance integrated circuits.

For example, as shown in FIG. 1A, dynamic amplifier 100 includes four MOS transistors (e.g., transistors 104P, 102P, 109, 110) with source/drain paths connected in series between power supply voltage $V_{dd}$ and circuit ground. If power supply voltage $V_{dd}$ is on the order of 1.0V, little drain-to-source voltage (Vas) margin is available to maintain all of these devices in saturation, especially over the full scale range of differential input voltage $V_{in}$ that may be specified. In addition, FIG. 1B illustrates that the common mode voltage at output terminals INTP, INTM falls as integrating capacitors 106P, 106M discharge during amplification, which tends to push one or more of the transistors in the series-coupled path out of saturation.

Figure 1C:
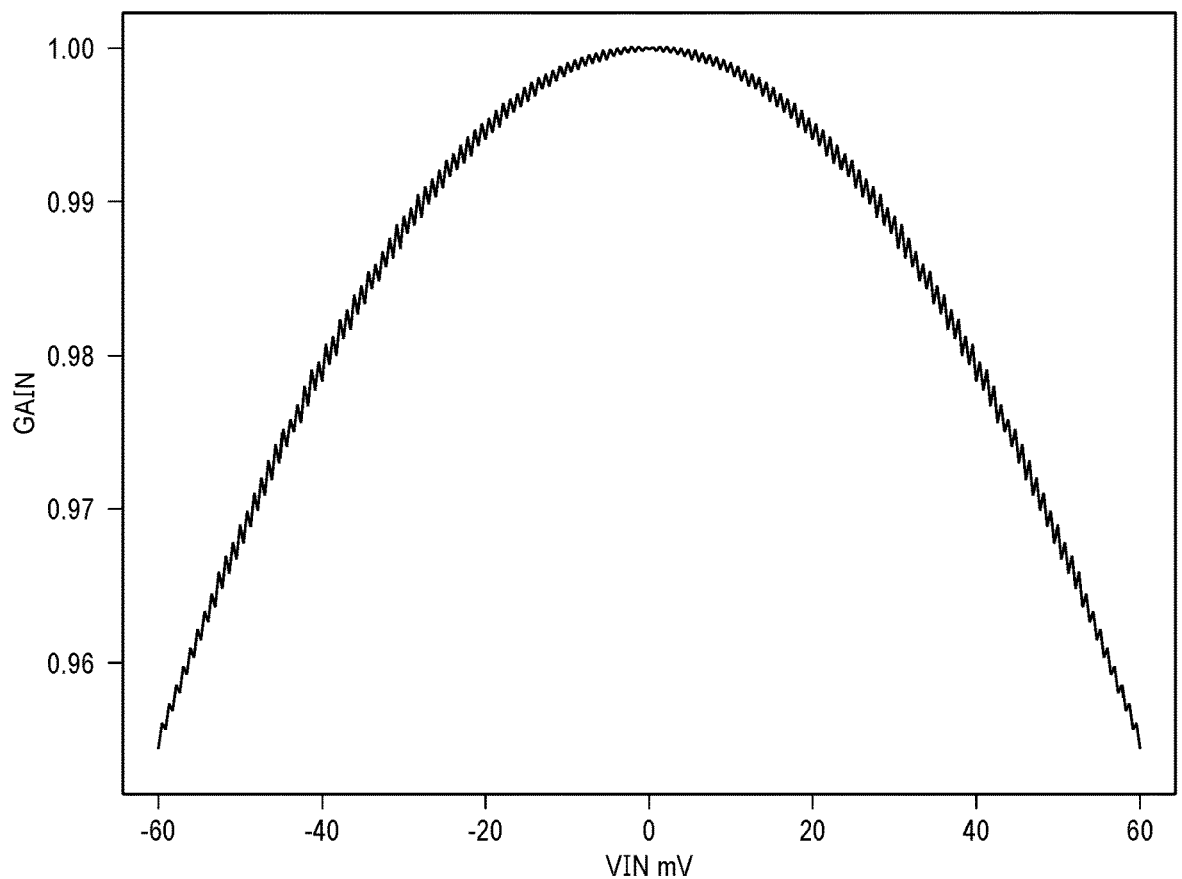
FIG. 1C is a plot of gain versus input voltage for an example of the dynamic amplifier of FIG. 1A.

As such, dynamic amplifier 100 can exhibit non-linearity in its gain with variations in input differential voltage. For example, the gain of dynamic amplifier 100 has been observed to exhibit a quadratic characteristic over the input voltage range, where the squared term (e.g., $V_{in}^2$ term of the gain equation) has a negative coefficient. FIG. 1C illustrates an example normalized plot of this gain characteristic for dynamic amplifier 100, where the gain falls off with increasing differential input voltage, exhibiting a "compressive" non-linearity.

Figure 3:
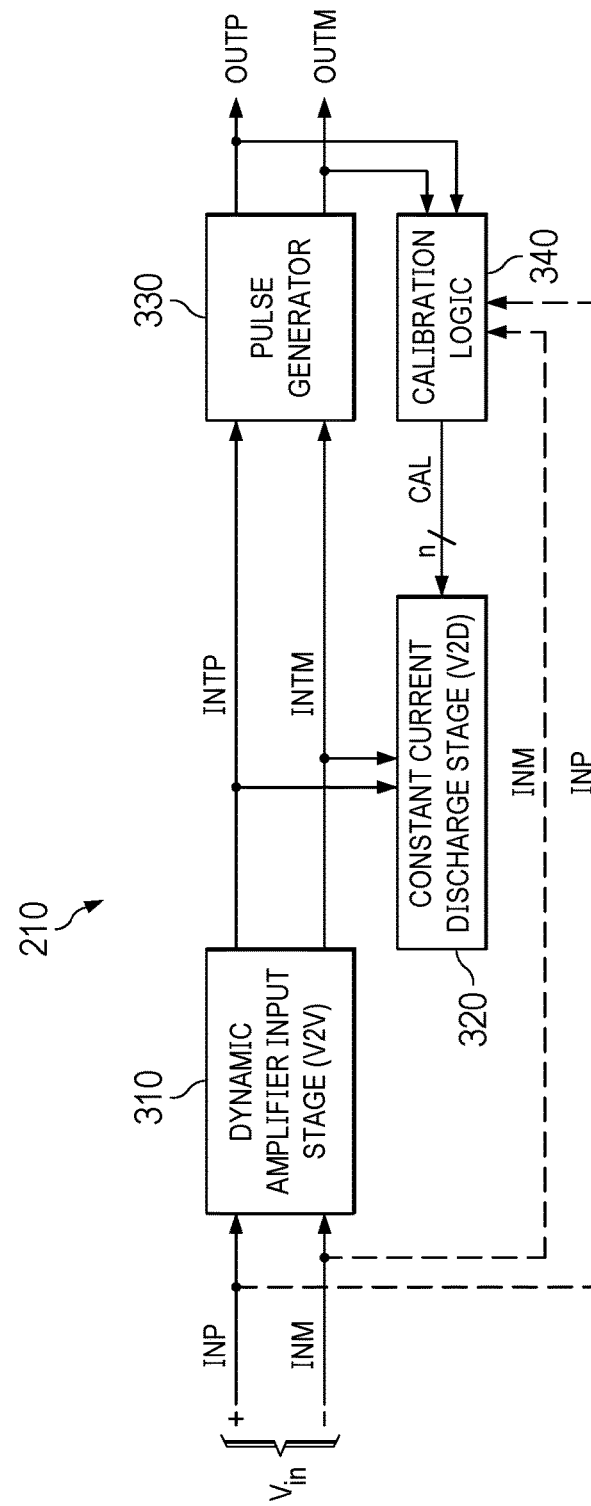
FIG. 3 is an electrical diagram, in block form, of an example voltage-to-delay (V2D) converter.

FIG. 3 illustrates an example V2D converter 210 in ADC 200. V2D converter 210 in this example includes dynamic amplifier input stage 310, constant current discharge stage 320, pulse generator 330, and calibration logic 340.

In this example, dynamic amplifier input stage 310 is a differential dynamic amplifier, with differential input terminals INP, INM receiving a differential input voltage $V_{in}$. Dynamic amplifier input stage 310 performs a voltage-to-voltage (V2V) conversion of input voltage $V_{in}$ to develop a corresponding differential voltage at intermediate output nodes INTP, INTM. Constant current discharge stage 320 is coupled to intermediate output nodes INTP, INTM, as are inputs of pulse generator 330. Pulse generator 330 generates logic level pulses at output terminals OUTP, OUTM, based on the voltages at intermediate output nodes INTP, INTM, respectively. The relative delay of the logic level pulses at output terminals OUTP, OUTM from pulse generator 330 reflects the differential input voltage $V_{in}$ at the inputs of dynamic amplifier input stage 310, effecting the voltage-to-delay (V2D) conversion to a delay domain signal ΔT.

Calibration logic 340 in this example of V2D converter 210 has inputs coupled to output terminals OUTP, OUTM, and one or more outputs CAL coupled to constant current discharge stage 320. Optionally, calibration logic 340 may also have inputs coupled to input terminals INP, INM. Calibration logic 340 includes analog or digital logic arranged to generate a calibration word at its outputs CAL in response to a comparison of the pulses at output terminals OUTP, OUTM with a known input value (e.g., as communicated from input terminals INP, INM).

Figure 4A:
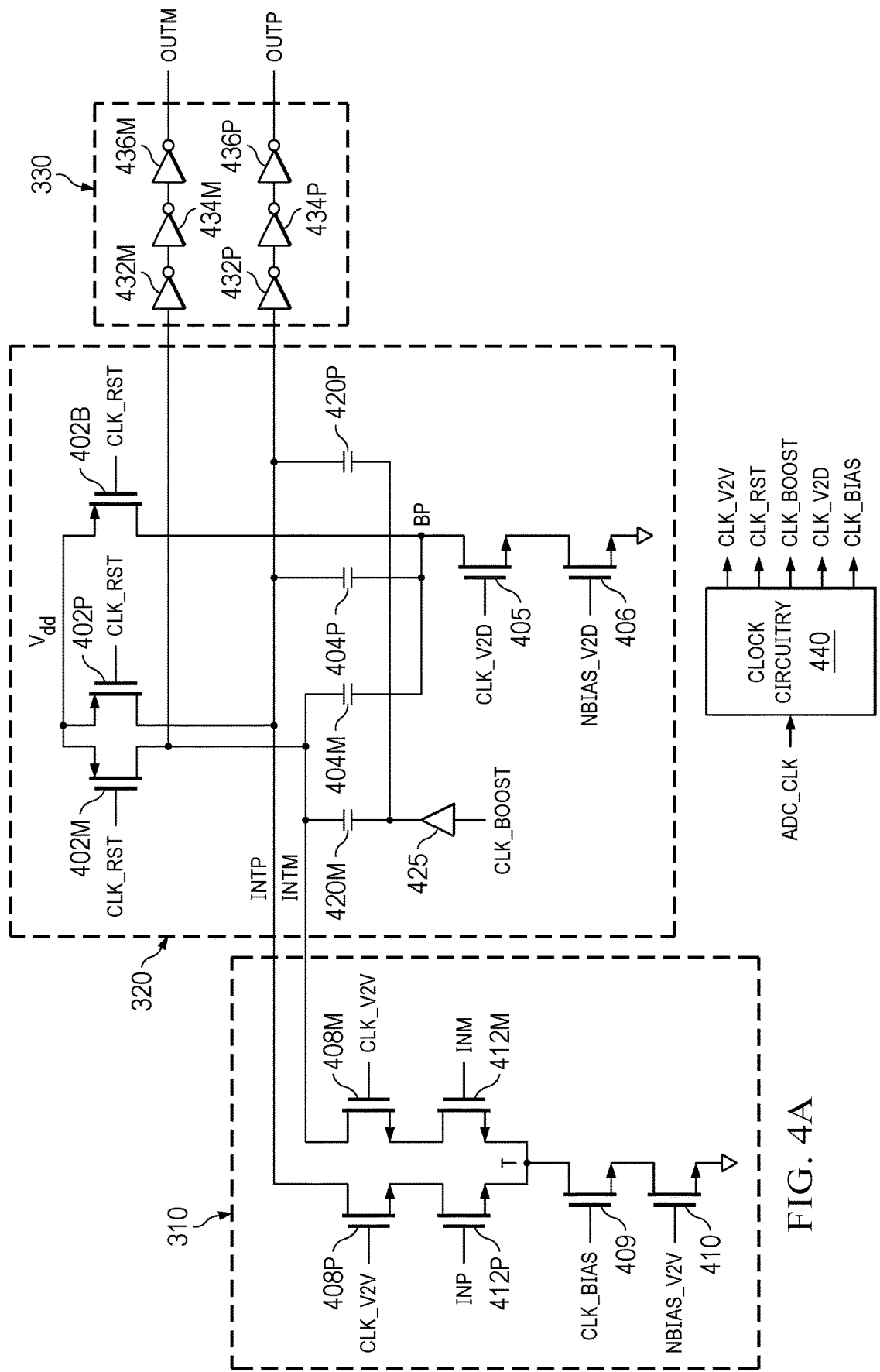
FIG. 4A is an electrical diagram, in schematic form, of an example dynamic amplifier, constant current discharge circuit, and pulse generator of the V2D converter of FIG. 3.

FIG. 4A illustrates the construction of an example dynamic amplifier input stage 310, an example constant current discharge stage 320, and an example pulse generator 330 as implemented into V2D converter 210. V2D converter 210 also includes and is under the timing control of clock circuitry 440. Dynamic amplifier input stage 310 includes NMOS transistors 408P, 408M, 409, 410, 412P, and 412M. Constant current discharge stage 320 includes PMOS transistors 402M, 402P, 402B, NMOS transistors 405, 406, integrating capacitors 404P, 404M, boost capacitors 420P, 420M, and boost driver 425. Pulse generator 330 includes inverters 432P, 432M, 434P, 434M, 436P, 436M.

NMOS transistor 408P in dynamic amplifier input stage 310 has a drain coupled to an intermediate output node INTP, and a gate receiving clock signal CLK_V2V from clock circuitry 440. The source of NMOS transistor 408P is coupled to the drain of NMOS input transistor 412P, which has a gate coupled to input terminal INP and a source coupled at node T to the drain of NMOS transistor 409. Similarly, NMOS transistor 408M has a drain coupled to an intermediate output node INTM, and a gate receiving clock signal CLK_V2V from clock circuitry 440. The source of NMOS transistor 408M is coupled to the drain of NMOS input transistor 412M, which has a gate coupled to input terminal INM and a source coupled at node T to the drain of NMOS transistor 409. NMOS transistor 409 has a gate receiving clock signal CLK_BIAS from clock circuitry 440, and a source coupled to the drain of NMOS transistor 410. NMOS transistor 410 has a source coupled to a common potential (e.g., circuit ground) and a gate receiving reference voltage NBIAS_V2V. Reference voltage NBIAS_V2V may be a regulated voltage, for example generated by voltage regulator circuitry. Voltage NBIAS_V2V controls the total current conducted by the two input transistor legs (e.g., the sum of the currents conducted by input transistors 412P and 412M), such that NMOS transistor 410 operates as a current source.

Integrating capacitor 404P in constant current discharge stage 320 has a top plate coupled to intermediate output node INTP. Integrating capacitor 404M has a top plate coupled to intermediate output node INTM. PMOS reset transistor 402P has a drain coupled to intermediate output node INTP and a source coupled to power supply voltage $V_{dd}$, and PMOS reset transistor 402M similarly has a drain coupled to intermediate output node INTM and a source coupled to power supply voltage $V_{dd}$. Integrating capacitors 404P, 404M each have a bottom plate coupled at a node BP to the drain of NMOS transistor 405. NMOS transistor 405 has a gate receiving clock signal CLK_V2D from clock circuitry 440, and a source coupled to the drain of NMOS transistor 406. NMOS transistor 406 has a source coupled to circuit ground and a gate receiving reference voltage NBIAS_V2D. Voltage NBIAS_V2D may be a regulated voltage generated by voltage regulator circuitry included in V2D converter 210 or elsewhere in the same integrated circuit. PMOS reset transistor 402B has a drain coupled to node BP at the bottom plates of integrating capacitors 404P, 404M, and a source coupled to power supply voltage $V_{dd}$. PMOS reset transistors 402B, 402P, 402M each has its gate receiving reset clock signal CLK_RST from clock circuitry 440.

Boost capacitor 420P has a top plate coupled to intermediate output node INTP and boost capacitor 420M has a top plate coupled to intermediate output node INTM. The bottom plates of boost capacitors 420P, 420M are coupled to the output of boost driver 425, which has an input receiving boost clock signal CLK_BOOST from clock circuitry 440. FIG. 4A illustrates boost capacitors 420P, 420M as single instances. However, each of boost capacitors 420P, 420M may be implemented as multiple capacitors in parallel, as described below.

Clock circuitry 440 may be provided within ADC 200 or elsewhere in the same integrated circuit with ADC 200. Clock circuitry 440 includes the appropriate clock generator circuits for generating clock signals CLK_V2V, CLK_RST, CLK_BOOST, CLK_V2D, and CLK_BOOST at the appropriate times in a conversion cycle. In an example, clock circuitry 440 generates these clock signals in response to a sample clock ADC_CLK operating at the desired conversion rate.

Pulse generator 330 in this example includes a pair of inverter chains. In one inverter chain, inverter 432P has an input coupled to intermediate output node INTP, with inverters 434P and 436P coupled in series at the output of inverter 432P. The output of inverter 436P is coupled to output terminal OUTP. Similarly, inverter 432M has an input coupled to intermediate output node INTM. Inverters 434M and 436M are coupled in series at the output of inverter 432M. Inverter 436M has an output driving output terminal OUTM.

FIG. 4B illustrates the example operation of V2D converter 210 of FIG. 4A. In this example, each conversion cycle can be considered to include a reset phase, a V2V phase, and a V2D phase. In the reset phase, integrating capacitors 404P, 404M and boost capacitors 420P, 420M are charged by reset transistors 402P, 402M, respectively, toward power supply voltage $V_{dd}$. In the V2V phase, dynamic amplifier input stage 310 develops a differential voltage at intermediate output nodes INTP, INTM in response to a differential voltage at input terminals INP, INM. In the V2D phase, constant current discharge stage 320 forwards the differential voltage at intermediate output nodes INTP, INTM to pulse generator 330, and pulse generator 330 generates pulses at output terminals OUTP, OUTM that have a relative delay corresponding to the differential voltage at input terminals INTP, INTM.

The conversion cycle shown in FIG. 4B begins at time to with clock circuitry 440 driving each of clock signals CLK_RST, CLK_V2V, and CLK_V2D to a low logic level, enabling the reset phase. In this reset phase, reset transistors 402P, 402M, 402B are turned on by the low level of clock signal CLK_RST, and transistors 408P, 408M in dynamic amplifier input stage 310 and transistor 405 in constant current discharge stage 320 are turned off. Reset transistors 402P, 402M, 402B in the on stage charge integrating capacitors 404P, 404M and boost capacitors 420P, 420M toward power supply voltage $V_{dd}$ (e.g., at about 1.0V in this example). This precharged voltage appears at both of intermediate output nodes INTP, INTM as shown in FIG. 4B.

After integrating capacitors 404P, 404M and boost capacitors 420P, 420M are charged in the reset phase, clock circuitry 440 drives clock signal CLK_RST to a high logic level at time $t_1$ shown in FIG. 4B. The high logic level of clock signal CLK_RST turns off reset transistors 402P, 402M, 402B, and turns on transistors 408P, 408M in dynamic amplifier input stage 310. Clock signal CLK_V2D remains at a low level at this time, holding off transistor 405 in constant current discharge stage 320. In this V2V stage, a differential voltage at input terminals INP, INM, such as may be acquired by a sample-and-hold circuit, develops a differential voltage at intermediate output nodes INTP, INTM. In the example of FIG. 4B, a negative differential input voltage (input terminal INTP at a lower voltage than input terminal INTM) has turned on input transistor 412M harder than input transistor 412P. As a result, intermediate output node INTM discharges more rapidly in the V2V stage than does intermediate output node INTP, as shown in FIG. 4B. The total discharge current through input transistors 412P, 412M is controlled by transistor 410, operating as a current source in dynamic amplifier input stage 310.

As evident from FIG. 4B, both of intermediate output nodes INTP, INTM are discharging through dynamic amplifier input stage 310 during the V2V phase. Accordingly, the common mode voltage $V_{CM\_INT}$ (e.g., the midpoint voltage) of intermediate output nodes INTP, INTM also falls during the V2V phase. According to this example, clock circuitry 440 begins ramping signal CLK_BOOST from a low level during the V2V phase. The ramping up in voltage of signal CLK_BOOST causes boost driver 425 to drive the bottom plates of boost capacitors 420P, 420M, slowing the rate at which intermediate output nodes INTP, INTM discharge in the V2V phase. The common mode voltage $V_{CM\_INT}$ at intermediate output nodes INTP, INTM remains higher as a result, helping to maintain the transistors of dynamic amplifier input stage 310 in saturation. At about the end of the V2V phase, signal CLK_BOOST reaches a selected voltage (e.g., about 250 mV) and is held at this voltage by clock circuitry 440.

Clock circuitry 440 initiates the V2D phase of the conversion cycle at time $t_2$, in the example of FIG. 4B, by driving clock signal CLK_V2D to a high level and driving clock signal CLK_V2V to a low level. The low logic level of clock signal CLK_V2V turns off transistors 408P, 408M in dynamic amplifier input stage 310, which decouples input transistors 412P, 412M from intermediate output nodes INTP, INTM, respectively. The high logic level of clock signal CLK_V2D in the V2D phase turns on transistor 405 of constant current discharge stage 320. Responsively, the bottom plates of integrating capacitors 404P, 404M at node BP discharge toward circuit ground through transistors 405, 406. The total discharge current is controlled by transistor 406 operating as a current source. In this example, the discharge of the bottom plates of integrating capacitors 404P, 404M with a constant current helps to isolate the headroom for current source transistor 406 from the voltage at the integrating capacitor top plates. This effect has been observed to significantly reduce noise effects in the constant current discharge stage. This effect also reduces flicker noise from that exhibited by dynamic amplifiers in which the integrating capacitors are discharged from the top plates, as in the example of FIG. 1A.

The voltages at intermediate output nodes INTP, INTM continue to fall during the V2V phase of this conversion cycle, as shown in FIG. 4B. In this example, intermediate output node INTM falls to the input threshold of inverter 432M in pulse generator 330 at about time $t_3$ in the V2D phase. In response to intermediate output node INTM falling to this level, the chain of inverters 432M, 434M, 436M in pulse generator 330 generate a low-to-high transition at output terminal INTM. At some time later, shown as time $t_4$ in FIG. 4B, intermediate output node INTP falls to the input threshold of inverter 432P in pulse generator 330. This results in a low-to-high-transition at output terminal INTP as generated by inverters 432P, 434P, 436P of pulse generator 330. The relative delay ΔT between the low-to-high transitions of output terminals OUTP, OUTPM indicates the magnitude of the differential input voltage applied to input terminals INP, INM. For example, a larger input differential voltage generates a longer relative delay at output terminals OUTP, OUTM. The polarity of the differential voltage at input terminals INP, INM determines which of the pulses at output terminals OUTP, OUTM leads the other.

Clock circuitry 440 ends the V2D phase of the conversion cycle, at about time $t_5$ in FIG. 4B, by driving clock signals CLK_V2D and CLK_RST to a low level. As intermediate output nodes INTP, INTM are again precharged toward power supply voltage $V_{dd}$, causing pulse generator 330 to drive both of output terminals OUTP, OUTM to a high logic level during this reset phase of the next conversion cycle.

Figure 4C:
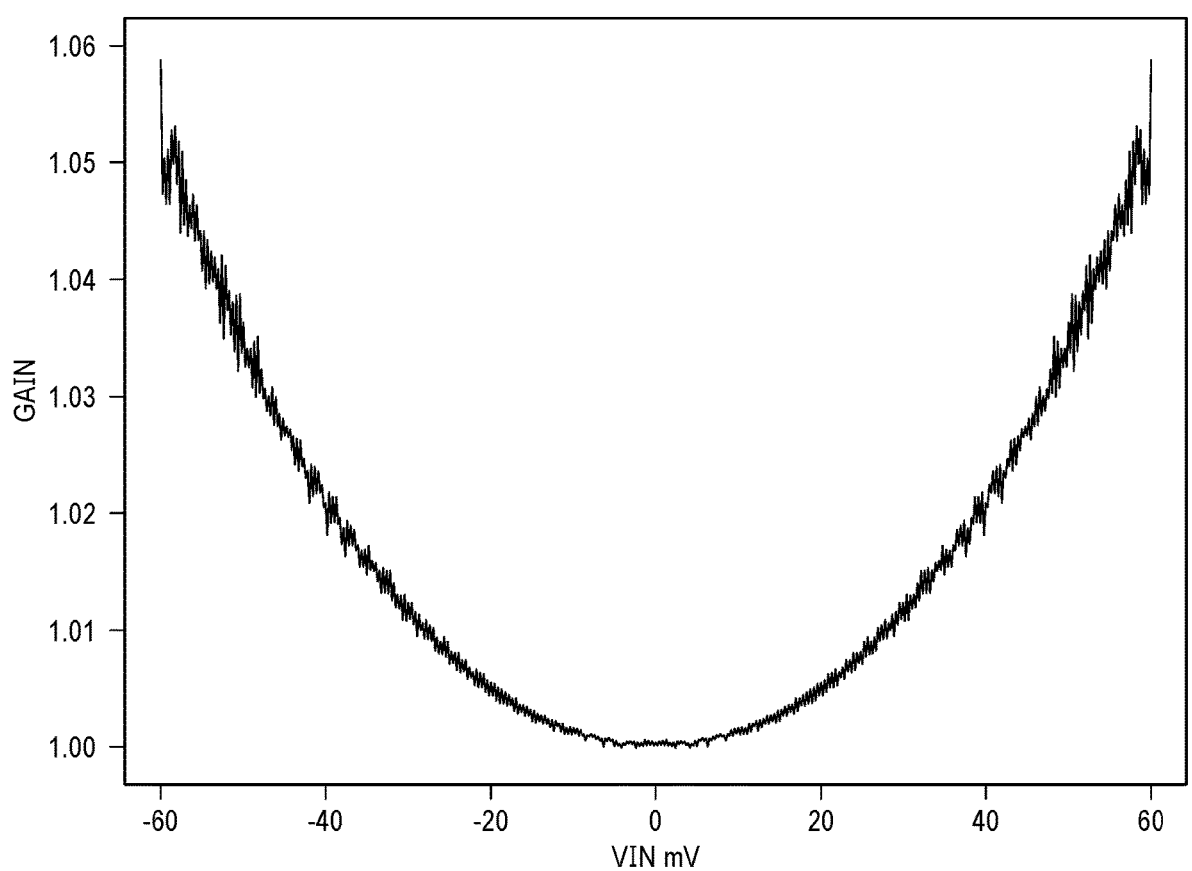
FIG. 4C is a plot of gain versus input voltage for an example of the constant current discharge circuit of FIG. 4A.

As described above relative to FIG. 1C, dynamic amplifiers such as that shown in FIG. 1A exhibit compressive non-linearity in their gain characteristics, in that the gain of the amplifier decreases with increasing differential input voltage substantially according to a quadratic characteristic. In the example of V2D converter 210 of FIG. 4A, dynamic amplifier input stage 310 can exhibit a similar nonlinearity characteristic. In this example, however, constant current discharge stage 320 constructed as shown in FIG. 4A exhibits "expansive" non-linearity in its gain characteristic, also substantially according to a quadratic characteristic. FIG. 4C illustrates an example of a quadratic expansive gain characteristic for an example of constant current discharge stage 320. As evident from FIG. 4C, gain increases with increasing differential input voltage. The combination of dynamic amplifier input stage 310 with constant current discharge stage 320 provides two opposing non-linearity characteristics that can effectively cancel out. The resulting V2D converter 210 thus exhibits excellent gain linearity over its full scale input voltage range.

In a general sense, an expression of the gain $Gain_{v2v}$ of dynamic amplifier input stage 310 as a function of differential input voltage $V_{in}$ follows a quadratic relationship:

$$Gain_{v2v} = G_{v2v}(1 + A_1 V_{in} - A_2 V_{in}^2) \quad (2)$$

where $G_{v2v}$ is a nominal gain of input stage 310, and $A_1$ and $A_2$ are positive-valued coefficients. In one example, coefficient $A_1$ is several orders of magnitude smaller than coefficient $A_2$. The negative sign of the squared term in this equation (2) indicates a compressive non-linearity, in that $Gain_{v2v}$ decreases with increasing differential input value $V_{in}$. A similar expression of the gain $Gain_{v2d}$ of constant current discharge stage 320 with respect to differential input voltage $V_{in}$ follows a quadratic relationship:

$$Gain_{v2d} = G_{v2d}(1 + B_1 V_{in} - B_2 V_{in}^2) \quad (3)$$

where $G_{v2d}$ is a nominal gain of constant current discharge stage 320, and $B_1$ and $B_2$ are positive-valued coefficients. In one example, coefficient $B_1$ is several orders of magnitude smaller than coefficient $B_2$. The positive sign of the squared term in this equation (3) indicates an expansive non-linearity, in that $Gain_{v2d}$ increases with increasing differential input value $V_{in}$. According to this example, constant current discharge stage 320 is implemented so that the value of its squared-term coefficient $B_2$ in equation (3) approximates that of the squared-term coefficient $A_2$ in equation (2).

Analysis of the delay at one of intermediate output nodes INTP, INTM (e.g., intermediate output node INTP for the following discussion) during the V2D phase of the conversion cycle provides an expression for squared-term coefficient $B_2$ in equation (3) of:

$$B_2 = \frac{1}{V_k^2} \quad (4)$$

where:

$$V_k = \left(\frac{C_{404}}{C_{404} + C_{420}}\right)(V_{dd} + IR) + V_{th} - V_{CM\_INT} \quad (5)$$

where $C_{404}$ and $C_{420}$ are the capacitances of integrating capacitor 404P and boost capacitor 420P (or integrating capacitor 404P and boost capacitor 420P), respectively. In this equation (5), I is the regulated current conducted by current source transistor 406, and R is the source resistance (e.g., the on-resistance $R_{on}$) of transistor 406, $V_{th}$ is the input threshold voltage of first inverters 432P and 432M in pulse generator 330, and $V_{CM\_INT}$ is the common mode output voltage at intermediate output nodes INTP, INTM. Accordingly, one may control the expansive non-linearity gain characteristic of equation (3) for constant current discharge stage 320 of FIG. 4A by controlling the capacitance ratio of integrating capacitors 404P, 404M and boost capacitors 420P, 420M, by controlling the resistance R of current source transistor 406, by controlling the threshold voltage at inverters 432P, 432M, or by controlling the common mode voltage of intermediate output nodes INTP, INTM.

Figure 5:
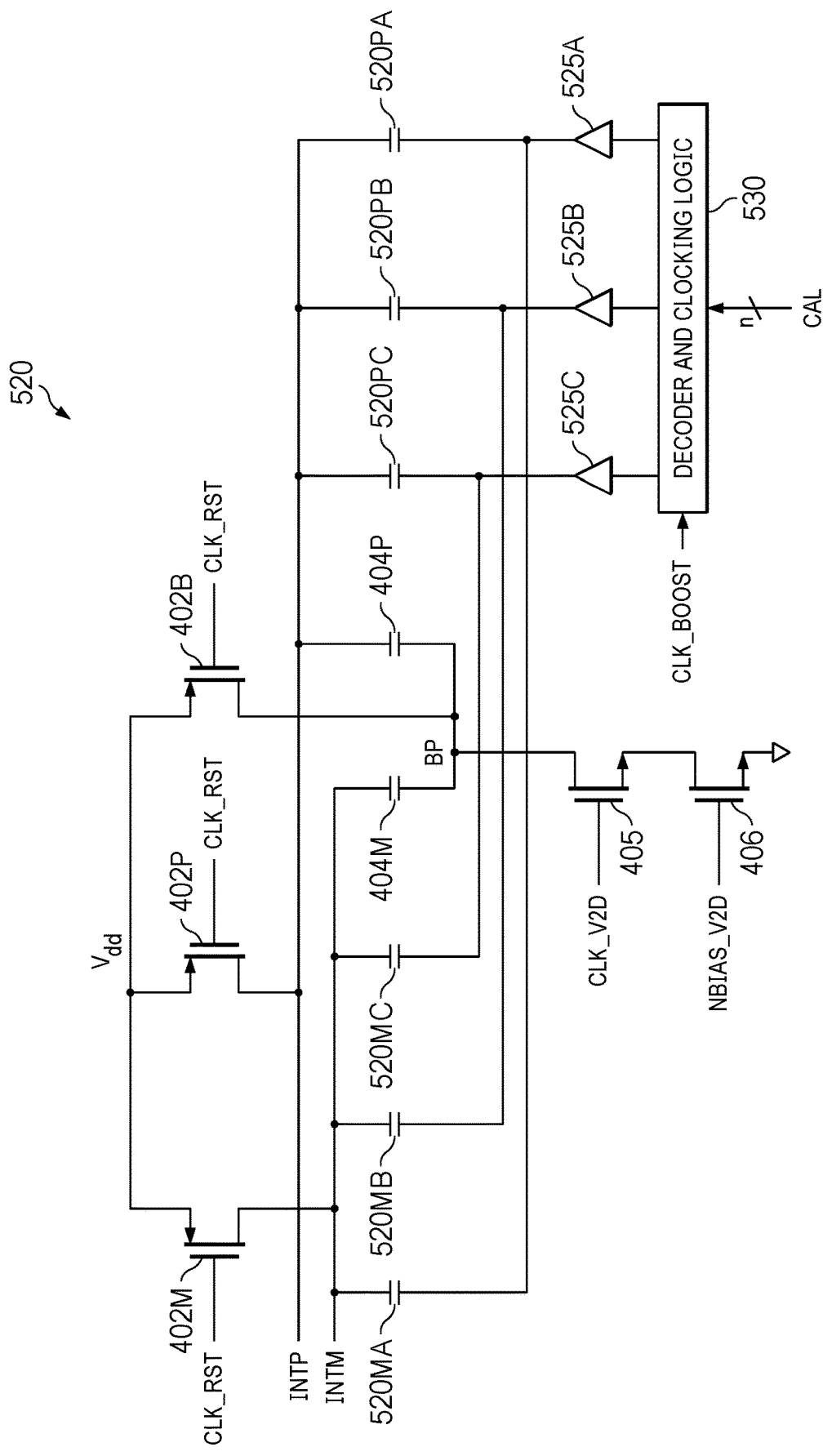
FIG. 5 is an electrical diagram, in schematic form, of another example constant current discharge circuit.

FIG. 5 illustrates an example of constant current discharge stage 520 that is arranged to control the common mode voltage $V_{CM\_INT}$ of intermediate output nodes INTP, INTM. More particularly, constant current discharge stage 520 controls common mode voltage $V_{CM\_INT}$ by controlling the amount of boost capacitance enabled in the V2D phase of the conversion cycle. Constant current discharge stage 520 includes reset transistors 402M, 402P, 402B, integrating transistors 404P, 404M, and NMOS transistors 405 and 406 as in the example of FIG. 4A.

As shown in FIG. 5, constant current discharge stage 520 includes multiple boost capacitors 520 coupled to each of intermediate output nodes INTP, INTM. In this example, three boost capacitors 520PA, 520PB, 520PC each has its top plate coupled to intermediate output node INTP. Similarly, three boost capacitors 520MA, 520MB, 520MC each has its top plate coupled to intermediate output node INTM. Boost driver 525A has an output coupled to the bottom plates of boost capacitors 520PA and 520MA. Boost driver 525B has an output coupled to the bottom plates of boost capacitors 520PB and 520MB. Boost driver 525C has an output coupled to the bottom plates of boost capacitors 520PC and 520MC. The capacitances of boost capacitors 520PA, 520PB, 520PC, and boost capacitors 520MA, 520MB, 520MC may be binary-weighted, equally-weighted, or have some other weighted relationship. In this example, three boost capacitors 520PA, 520PB, 520PC, and three boost capacitors 520MA, 520MB, 520MC are shown in FIG. 5. In other examples, more or fewer boost capacitors can alternatively be provided, depending on the desired resolution with which the common mode voltage $V_{CM\_INT}$ is to be adjusted.

Boost drivers 525A, 525B, 525C each have an input driven from outputs of decoder and clocking logic 530 in this example. Decoder and clocking logic 530 has an input receiving a calibration word CAL and a clock input receiving clock signal CLK_BOOST from clock circuitry 440 (FIG. 4A).

In operation, decoder and clocking logic 530 drives one or more of boost drivers 525A, 525B, 525C in response to clock signal CLK_BOOST at the appropriate time within the conversion cycle (e.g., beginning in the V2V stage and into the V2D stage, as shown in FIG. 4B). The selection of which boost drivers 525A, 525B, 525C are driven by decoder and clocking logic 530 is determined by the value of calibration word CAL received by decoder and clocking logic 530. Driving more boost capacitance at intermediate output nodes INTP, INTM (e.g., driving more of boost drivers 525A, 525B, 525C, or driving those associated with more boost capacitance) increases the effect of the boost capacitors, and thus slows the discharge of common mode voltage $V_{CM\_INT}$. Driving less boost capacitance at intermediate output nodes INTP, INTM allows common mode voltage $V_{CM\_INT}$ to discharge more rapidly.

Figure 6:
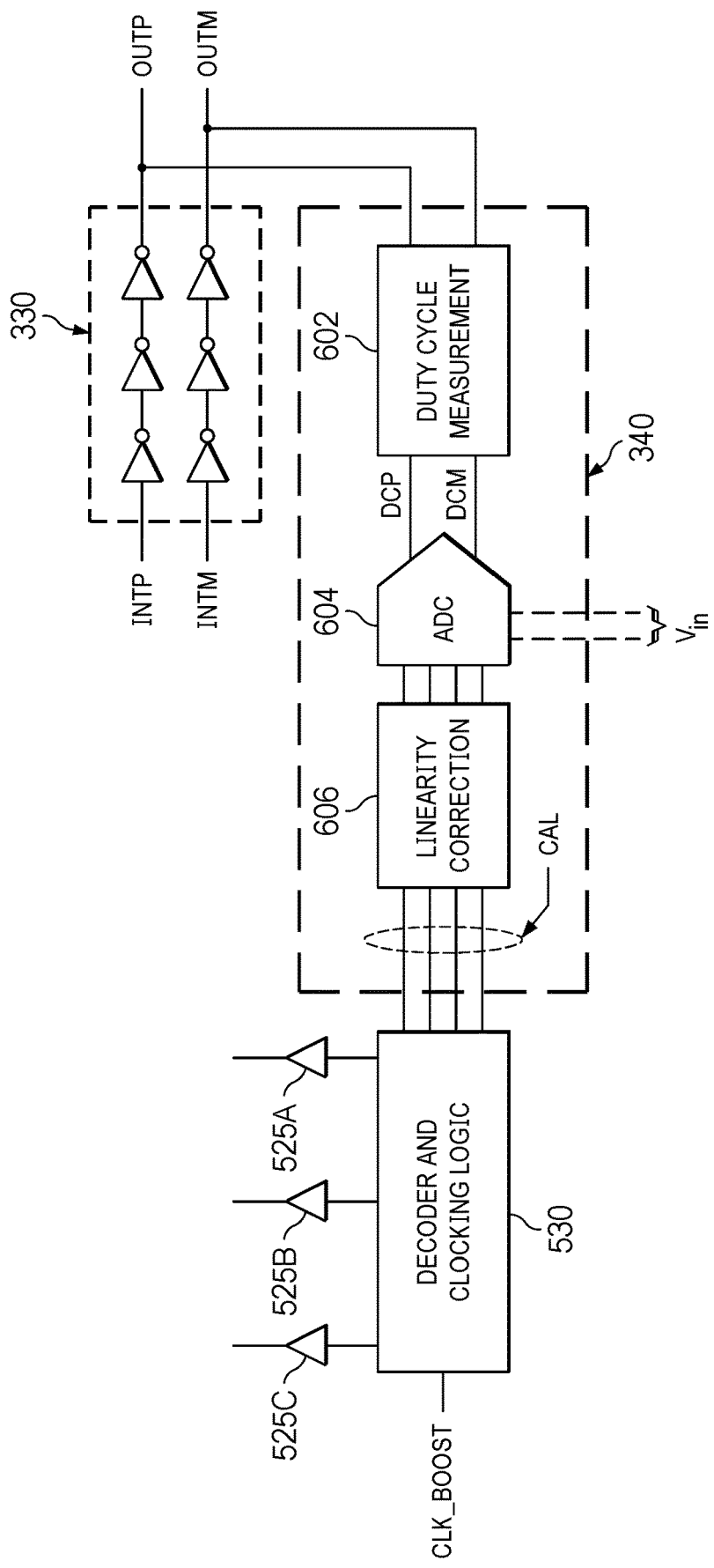
FIG. 6 is an electrical diagram, in schematic form, of example calibration logic for the V2D converter of FIG. 3.

FIG. 6 illustrates an example of calibration logic 340. Calibration logic 340 includes duty cycle measurement circuit 602, analog-to-digital converter (ADC) 604, and linearity correction circuit 606. Duty cycle measurement circuit 602 has inputs coupled to output terminals OUTP, OUTM, and corresponding outputs DCP, DCM coupled to inputs of ADC 604. Duty cycle measurement circuit 602 includes analog and digital circuitry arranged to measure the duty cycles of pulses at output terminals OUTP, OUTM, as pulse generator 330 generates those pulses in response to samples of the differential input voltage at input terminals INP, INM, as described above. In this example, outputs DCP, DCM from duty cycle measurement circuit 602 communicate analog levels indicating the measured duty cycles. ADC 604 includes multiple channels to convert each of the analog levels at its inputs to digital values. As shown in FIG. 6, ADC 604 may optionally include an additional channel to convert the current sample of differential input voltage $V_{in}$ (e.g., the input sample corresponding to the pulses at output terminals OUTP, OUTM received by calibration logic 340) to a digital value. The digital values obtained by ADC 604 are forwarded to an input of linearity correction circuit 606.

Linearity correction circuit 606 includes digital logic configured or programmed to analyze the linearity performance of V2D converter 210 over variations in differential input voltage $V_{in}$, and to provide appropriate values of calibration word CAL to decoder and clocking logic 530. Decoder and clocking logic 530 in turn selectively drives boost drivers 525A, 525B, 525C to adjust the boost kick at intermediate output nodes INTP, INTM, and thus control the common mode voltage at these nodes to compensate for detected non-linearity. For the example of FIG. 6 in which differential input voltage $V_{in}$ is forwarded (directly or indirectly) to calibration logic 340, the operation of linearity correction circuit 606 may be performed periodically during the normal operation of V2D converter 210. Alternatively or in addition, calibration logic 340 may be enabled to execute a calibration routine during a power-on reset routine or otherwise. Further in the alternative in which calibration logic 340 is enabled during a separate calibration routine, linearity correction circuit 606 may analyze the non-linearity of V2D converter 210 based on a preset sequence of differential input voltages over the input range. In this case, input voltage $V_{in}$ need not be applied to ADC 604.

In the example in which common mode voltage $V_{CM\_INT}$ is adjusted by controlling boost capacitance, improved linearity of V2D converter 210 can be attained. In one implementation evaluated by way of simulation, the quadratic gain characteristic of dynamic amplifier input stage 310 evaluates to:

$$\text{Gain}_{v2v} = G_{v2v}\left(1 + 9.03e^{-11}V_{in} - 4.43e^{-6}V_{in}^2\right). \tag{6a}$$

Figure 4D:
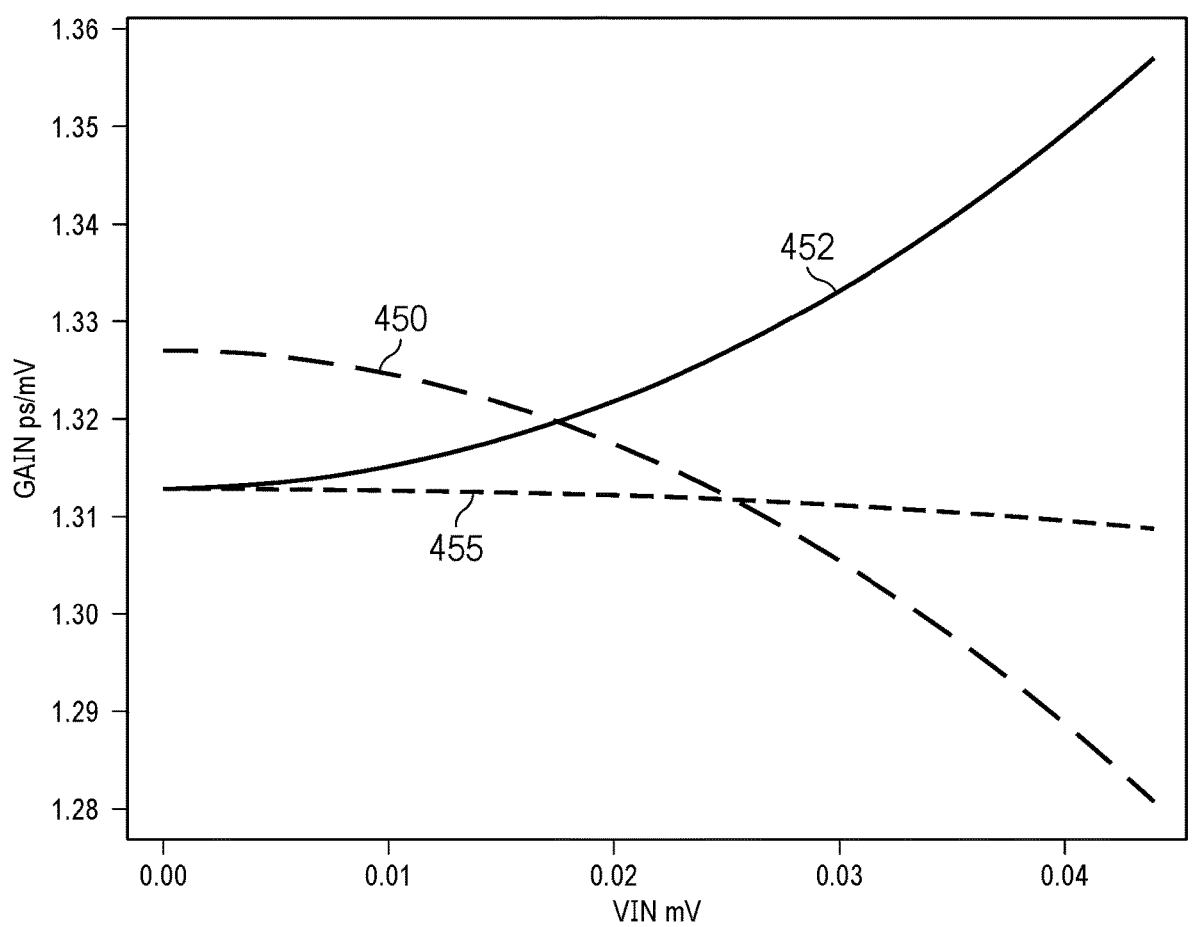
FIG. 4D is a plot of gain linearity versus input voltage for an example of the V2D converter of FIG. 4A.

As evident from this equation (6a), this gain characteristic is dominated by the negative-valued squared term, and is thus compressive. Curve 450 in FIG. 4D illustrates one side (e.g., for positive values of input voltage $V_{in}$) of this compressive gain characteristic. Similarly, the quadratic gain characteristic of an example of constant current discharge stage 320, after calibration of common mode voltage $V_{CM\_INT}$ according to the example of FIG. 5 and FIG. 6, evaluates to:

$$\text{Gain}_{v2d} = G_{v2v}\left(1 + 7e^{-11}V_{in} + 4.03e^{-6}V_{in}^2\right). \tag{6b}$$

Curve 452 illustrates this expansive gain characteristic over positive values of input voltage $V_{in}$. Accordingly, because of the close correspondence in the squared-term coefficient values, of opposite sign, in equations (6a) and (6b), the expansive gain characteristic of constant current discharge stage 320 closely compensates for the compressive gain characteristic of dynamic amplifier input stage 310. The combination of the two stages in V2D converter 210 according to this example can provide good linearity of gain over input voltage as shown by curve 455 in FIG. 4D. Quantitatively, the non-linearity of dynamic amplifier input stage 310 shown by curve 450 is 50.2 dBc. On the other hand, the non-linearity of constant current discharge stage 320 shown by curve 452 is about 51 dBc, but in the opposite direction. In this example, the combination of the two stages in V2D converter 210 as shown by curve 455 is about 72 dBc, providing an improvement of about 20 dBc with proper calibration.

Figure 7:
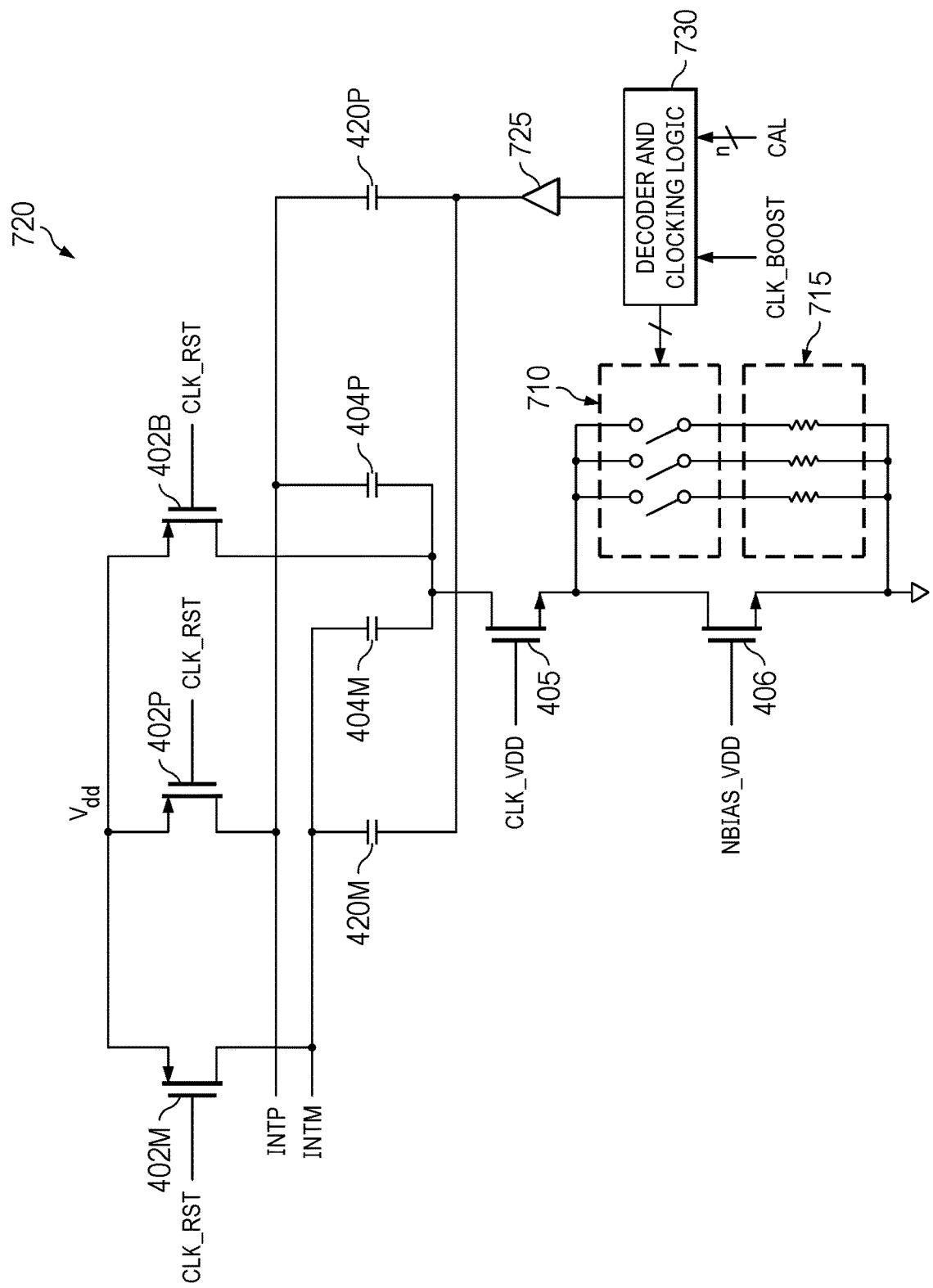
FIG. 7 is an electrical diagram, in schematic form, of another example constant current discharge circuit.

As described above, V2D converter 210 according to the example of FIG. 5 controls common mode voltage $V_{CM\_INT}$ by controlling the boost capacitance applied at intermediate output nodes INTP, INTM. This control can calibrate the non-linearity compensation applied by constant current discharge stage 320 to improve the linearity of V2D stage 210. As described above, other parameters may be calibrated to control the squared-term coefficient of the quadratic gain characteristic of equation (3) for constant current discharge stage 320. FIG. 7 illustrates constant current discharge stage 730 according to an example of such calibration of an alternate parameter. This alternate parameter is the source resistance R associated with current source transistor 406.

The example of constant current discharge stage 230 shown in FIG. 7 includes a set of switches 710 associated with a set of resistors 715. Each switch 710 is coupled in series with its associated resistor 715 between the drain of current source transistor 406 and its source, at circuit ground. FIG. 7 illustrates three series-connected switch 710 and resistor 715 networks coupled in parallel with one another. However, more or fewer switch and resistor networks may be implemented. Resistors 715 may be of different resistances, for example binary-weighted, or may be of the same resistance value.

Decoder and clocking logic 730 has an input receiving calibration word CAL and a clock input receiving clock signal CLK_BOOST, as before. Decoder and clocking logic 730 has an output coupled to an input of boost driver 725, which has an output coupled to the bottom plates of boost capacitors 420P, 420M. In addition, decoder and clocking logic 730 also has an output coupled to a control input of each switch 710.

In operation, decoder and clocking logic 730 receives calibration word CAL, for example from calibration logic 340. In response to the value of calibration word CAL, decoder and clocking logic 730 issues control signals to each switch 710. These control signals operate corresponding each of switches 710 to connect or disconnect its associated resistor 715 into or from parallel connection with the source/drain path of current source transistor 406. The total source resistance R of the current source implemented by transistor 406 is determined by the on-resistance $R_{on}$ of the transistor 406 itself, in parallel with the one or more of resistors 715 associated with a closed switch 710. As described above relative to equations (3) through (5), the squared-term coefficient $B_2$ in the quadratic expression of gain versus input voltage of constant current discharge stage 320 can be controlled by adjusting this source resistance R by way of the example of FIG. 7.

In this example, as shown in FIG. 7, decoder and clocking logic 730 can operate to drive boost driver 725 in response to clock signal CLK_BOOST. With the calibration of source resistance R by switches 710 and resistors 715 in this example, only single instances of boost capacitors 420P, 420M need be implemented. The driving of the bottom plates of boost capacitors 420P, 420M by boost driver 725 slows the discharge of common mode voltage $V_{CM\_INT}$, helping to maintain circuit transistors in saturation.

Figure 8:
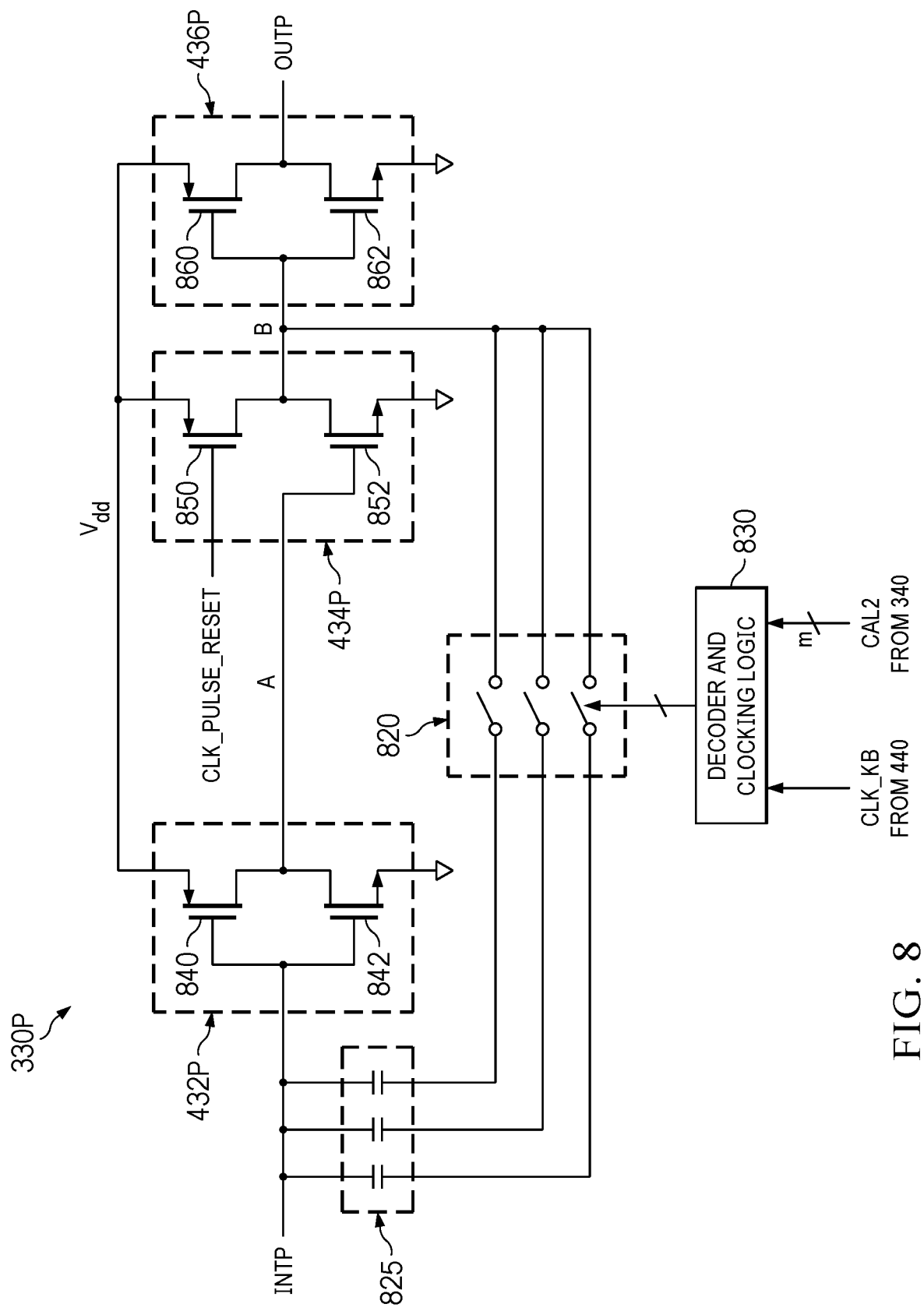
FIG. 8 is an electrical diagram, in schematic form, of a portion of an example pulse generator for the V2D converter of FIG. 3.

FIG. 8 illustrates an example of a portion 330P of pulse generator 330 coupled between an input at intermediate output node INTP and an output at output terminal OUTP. In this example, pulse generator 330 as a whole also includes a similarly-constructed portion 330M with an input at intermediate output node INTM and an output at output terminal OUTM.

As shown in FIG. 8, pulse generator portion 330P includes inverters 432P, 434P, 436P. Inverter 432P includes PMOS transistor 840 and NMOS transistor 842. Inverter 434P includes PMOS transistor 850 and NMOS transistor 852. Inverter 536P includes PMOS transistor 860 and NMOS transistor 862. Pulse generator portion 330P in this example includes a set of switches 820 associated with a set of capacitors 825. Each switch 820 is coupled in series with its associated capacitor 825 between intermediate output node INTP and the output of inverter 434P, at node B. FIG. 8 illustrates three series-connected switch 820 and capacitor 825 networks coupled in parallel with one another. However, fewer or more switch and capacitor networks may be implemented. Capacitors 825 may have different capacitances, for example binary-weighted, or may have the same capacitance as one another. Switches 820 each have a control input coupled to a corresponding output of decoder and clocking logic 830, so as to be independently controlled.

PMOS transistor 840 in inverter 432P has a source coupled to power supply voltage $V_{dd}$, a drain coupled to the drain of NMOS transistor 842 at output node A, and a gate coupled to the gate of NMOS transistor 842 at intermediate output node INTP. The drain of NMOS transistor 842 is at circuit ground. PMOS transistor 850 in inverter 434P has a source coupled to power supply voltage $V_{dd}$, and a drain coupled to the drain of NMOS transistor 852 at output node B. The source of NMOS transistor 852 is at circuit ground. The gate of NMOS transistor 852 is coupled to the output of inverter 432P at node A, and the gate of PMOS transistor 850 receives clock signal CLK_PULSE_RESET from clock circuitry 440. PMOS transistor 860 in inverter 436P has a source coupled to power supply voltage $V_{dd}$, a drain coupled to the drain of NMOS transistor 862 at output terminal OUTP, and a gate coupled to the gate of NMOS transistor 862 at output node B from inverter 434P. The drain of NMOS transistor 862 is at circuit ground.

In operation, pulse generator portion 330P is reset by clock circuitry 440 driving clock signal CLK_PULSE_RESET to a low logic level, for example during the V2V phase of the conversion cycle of V2D converter 210 (FIG. 4B). The low level of clock signal CLK_PULSE_RESET turns on PMOS transistor 850 of inverter 434P and forces output node B to power supply voltage $V_{dd}$. Inverter 436P in turn drives output terminal OUTP to a low logic level. Intermediate output node INTP is precharged toward power supply voltage $V_{dd}$ in the reset phase of the conversion cycle (FIG. 4B), causing output node A to be pulled to ground by NMOS transistor 842.

As intermediate output nodes INTP, INTM are discharged in the conversion cycle, the one of those nodes that is first discharged to the input threshold voltage of its inverter 432P, 432M, as the case may be, causes that inverter to change state. However, the transition at the output of that inverter can couple back to its corresponding input. For example, referring to pulse generator portion 330P of FIG. 8, a low-to-high transition at output node A of inverter 432P can couple back as a positive polarity noise pulse to the inverter input at intermediate output node INTP. This noise due to coupling at pulse generator 330 has been observed to degrade the linearity of V2D converter 210.

"Kick-back" capacitors 825 in the example of FIG. 8 are provided to cancel the effects of noise due to the switching of inverter 432P. The closing of one or more of switches 820 by decoder and clocking logic 830 couples the corresponding one or more of capacitors 825 between intermediate output node INTP and output node B of inverter 434P. Because inverter 434P makes the opposite transition from that made by inverter 432P, a high-to-low transition appears at output node B in response to the low-to-high transition at output node A. By coupling one or more capacitors 825 between intermediate output node INTP and output node B, this high-to-low transition at output node B is coupled back to intermediate output node INTP, providing a noise pulse of the opposite polarity from that caused by the transition of inverter 432P. Linearity of V2D converter 210 is thus improved by this example.

The capacitive coupling of kick-back capacitors 825 can be calibrated, for example by calibration logic 340 generating a corresponding calibration word CAL2 to decoder and clocking logic 830 as shown in FIG. 8. This calibration can be performed periodically during the normal operation of V2D converter 210, or alternatively (or additionally) during a calibration routine, for example during power-on reset.

Figure 9:
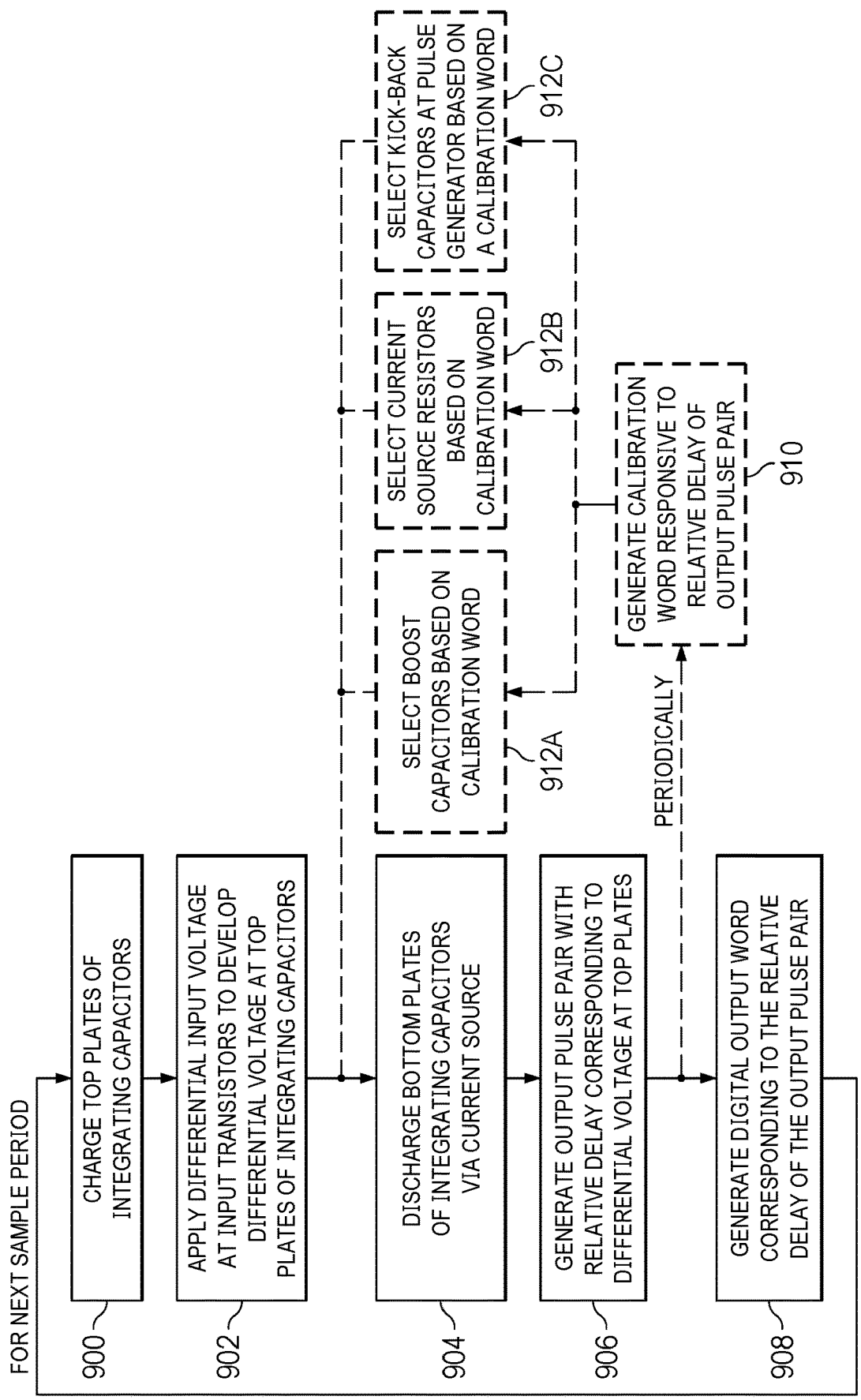
FIG. 9 is a flow diagram illustrating an example method of converting input voltage to a delay domain signal.

FIG. 9 illustrates an example method of converting input voltage to a delay domain signal, as may be performed by ADC 200 including T2D converter 210. The following description of this example method refers to the particular components of ADC 200 and T2D converter 210 described above relative to FIG. 4A et seq.

The example method of FIG. 9 illustrates the conversion of one sample of input voltage $V_{in}$, for example as may be performed by ADC 200 within a conversion cycle including the operations referred to relative to FIG. 4B. Continued operation of the example method of FIG. 9 for additional samples, for example at a selected sample or data rate corresponding to an incoming communications bitstream or data stream, can continue by way of repeating this example method in a loop.

The conversion cycle operations of FIG. 9 begin with process block 900, in which the top plates of integrating capacitors 404P and 404M are charged, for example to at or near power supply voltage $V_{dd}$. Referring to FIGS. 4A and 4B, process block 900 is performed by reset transistors 402P, 402M, 402B turned on by clock signal CLK_RST from clock circuitry 440. During this process block 900, the top plates of integrating capacitors 404P, 404M and also boost capacitors 420P, 420M are charged toward power supply voltage $V_{dd}$ through reset transistors 402P, 402M, 402B.

In process block 902, differential input voltage $V_{in}$ is applied at input terminals INP, INM. Clock circuitry 440 also turns off reset transistors 402P, 402M, 402B, and turns on transistors 408P and 408M. This allows input transistors 412P, 412M to differentially discharge the top plates of integrating capacitors 404P, 404M toward circuit ground according to the differential input voltage $V_{in}$ at input terminals INP, INM. A differential voltage at intermediate output nodes INTP, INTM appears as a result. Process block 902 corresponds to the V2V phase of the conversion cycle of FIG. 4B.

In process block 904, constant current discharge stage 320 of V2D converter 210 discharges the bottom plates of integrating capacitors 404P, 404M toward circuit ground through transistor 405 and current source transistor 406. Process block 904 in this example is initiated by clock signal CLK_V2D from clock circuitry 440 turning on transistor 405, initiating the V2D phase of the conversion cycle described above relative to FIG. 4B. The total discharge current from the bottom plates of integrating capacitors 404P, 404M, in process block 904, is controlled by current source transistor 406 in response to the regulated voltage NBIAS_V2D applied to its gate. Control of the conduction of current source transistor 406 by regulated voltage NBIAS_V2D can maintain this total discharge current to be substantially constant over variations in differential input voltage $V_{in}$.

Drive signal CLK_BOOST may also be applied at the input of boost driver 425 during the operation of process block 904 in the V2D phase to control the common mode voltage $V_{CM\_INT}$ at intermediate output nodes INTP, INTM, as described above. Signal CLK_BOOST may be initiated by clock circuitry 440 during the V2V phase (e.g., during process block 902), as described above relative to FIG. 4B.

The constant current discharge from the bottom plates of integrating capacitors 404P, 404M in process block 904 continues to discharge the voltages at intermediate output nodes INTP, INTM toward circuit ground, while maintaining the differential voltage across these nodes. At such point as the voltages at intermediate output nodes INTP, INTM discharge to the input threshold voltage of inverters 432P, 432M, respectively, process block 906 is performed by pulse generator 330 generating a corresponding pair of pulses (e.g., low-to-high logic level transitions) at output terminals OUTP, OUTM, respectively. The relative delay ΔT between the leading edges of the pulses at output terminals OUTP, OUTM corresponds to the polarity and magnitude of the differential input voltage applied at input terminals INTP, INTM.

In process block 908, TDC converter 220 generates a digital output word at output $D_{out}$ corresponding to the relative delay ΔT of the pulses at output terminals OUTP, OUTM as generated in process block 906. The manner in which the delay in these pulses is converted to a digital output word depends on the particular construction and arrangement of TDC converter 220. Examples of architectures that may be used in TDC converter 220 are described in the above-incorporated U.S. Patents and Publications.

As described above, constant current discharge stage 320 can be calibrated to operate in process block 904 according to a gain characteristic having a non-linearity behavior that opposes and thus compensates non-linearity of the gain characteristic of dynamic amplifier input stage 310. In the examples described above, this calibration involves adjustment of parameters including the common mode voltage $V_{CM\_INT}$ of intermediate output nodes INTP, INTM, the source resistance R of the constant current discharge current source, and others. Adjustment of one or more of these parameters can adjust the squared-term coefficient in the quadratic gain characteristic for constant current discharge stage 320 to match that of the characteristic for dynamic amplifier input stage 310, but with opposite sign. This calibration may be performed at the time of manufacture, at power-on or in other reset routines, or periodically during normal operation of ADC 200. In any event, this calibration of the gain of constant current discharge stage 320 begins in the example method of FIG. 9 with process block 910.

In process block 910, the pulses at output terminals OUTP, OUTM are applied to inputs of calibration logic 340. In this example, process block 910 includes measurement of the duty cycle of the pulses at output terminals OUTP, OUTM by measurement circuit 602 to generate analog values at its outputs DCP, DCM. ADC 604 converts these analog levels to digital values, and forwards those digital values to linearity correction circuit 606. Also in process block 910, linearity correction circuit 606 generates a calibration word CAL in response to the digitized duty cycles values relative to an input value (e.g., differential input voltage $V_{in}$ as forwarded to ADC 604, or a stored reference value according to programmed calibration routine).

As noted above, calibration may be performed on one or more various parameters, shown in FIG. 9 by process blocks 912A, 912B, 912C. In process block 912A, which corresponds to the example described above relative to FIG. 5, calibration word CAL is used to select one or more boost capacitors 520PA, 520PB, and 520C, and one or more boost capacitors 520MA, 520MB, 520MC, to be driven by corresponding boost drivers 525A, 525B, 525C and thus adjust the common mode voltage $V_{CM\_INT}$. In process block 912B, which corresponds to the example described above relative to FIG. 7, calibration word CAL is used to close one or more of switches 710 to include a corresponding one or more of resistors 715 into the effective source resistance R of current source transistor 406 in constant current discharge stage 720.

In addition, process block 912C may additionally be performed, for example in response to the same or a different calibration word CAL2 generated in process block 910. Process block 912C is performed to close one or more of switches 820 to include a corresponding one or more of capacitors 825 as "kick-back" capacitors at pulse generator 330, as described above in the example of FIG. 8.

Following the performing of one or more of calibration process blocks 912A, 912B, 912C, operation of V2D converter 210 may continue, for example from the operation of constant current discharge stage 320 in process block 904.

One or more example technical advantages may be enabled according to the described examples. The use of boost capacitors at the constant current discharge stage helps to maintain the input stage transistors in saturation and to control the output common mode voltage. Improved noise performance, reduced sensitivity to input transistor mismatches, and improved current source headroom can be attained. Calibration of the constant current discharge block enables improvement in linearity of the T2D stage by providing a gain characteristic that cancels non-linearity in the input stage, providing good linearity over variations in process, voltage, and temperature.

The one or more examples described in this specification are implemented into a delay-domain analog to digital converter, as it is contemplated that such implementation is particularly advantageous in that context. However, it is also contemplated that aspects of these examples may be beneficially applied in other applications operating in the delay domain. Accordingly, it is to be understood that the following description is provided by way of example only, and is not intended to limit the true scope of this invention as claimed.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. Components shown as switches may be implemented as single transistors controlled by a gate voltage, as pass gates of complementary transistors coupled in parallel and controlled by complementary gate voltages, or by other devices and circuits suitable for the relevant manufacturing technology.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A voltage-to-delay converter circuit comprising:
   a first reset transistor having a first terminal coupled to a power supply terminal, and having a gate terminal coupled to receive a reset signal;
   a first integrating capacitor having a first terminal coupled to a second terminal of the first reset transistor and having a second terminal;
   a second reset transistor having a first terminal coupled to the power supply terminal, and having a gate terminal coupled to receive the reset signal;
   a second integrating capacitor having a first terminal coupled to a second terminal of the second reset transistor and having a second terminal;
   a first current source having a first terminal coupled to a common potential;
   a first input transistor having a first terminal coupled to a second terminal of the first current source, a second terminal coupled to the first terminal of the first integrating capacitor, and a gate terminal coupled to receive a first input voltage;
a second input transistor having a first terminal coupled to the second terminal of the first current source, a second terminal coupled to the first terminal of the second integrating capacitor, and a gate terminal coupled to receive a second input voltage;
a discharge current source having a first terminal coupled to a second terminal of each of the first and second integrating capacitors, and a second terminal coupled to the common potential; and
a pulse generator having a first input coupled to the first terminal of the first integrating capacitor, a second input coupled to the first terminal of the second integrating capacitor, and first and second outputs.

2. The converter circuit of claim 1, further comprising:
a first boost capacitor having a first terminal coupled to the first terminal of the first integrating capacitor, and having a second terminal;
a second boost capacitor having a first terminal coupled to the first terminal of the second integrating capacitor, and having a second terminal; and
a boost driver having an output coupled to the second terminal of each of the first and second boost capacitors.

3. The converter circuit of claim 2, wherein the boost driver has an input coupled to receive a boost clock signal; and further comprising:
clock circuitry for generating the boost clock signal.

4. The converter circuit of claim 2, wherein the first boost capacitor is one of a first plurality of boost capacitors, each having a first terminal coupled to the first terminal of the first integrating capacitor, and having a second terminal;
wherein the second boost capacitor is one of a second plurality of boost capacitors, each having a first terminal coupled to the first terminal of the second integrating capacitor, and having a second terminal;
wherein the boost driver is one of a plurality of boost drivers, each having an output coupled to the second terminal of one of the first plurality of boost capacitors and one of the second plurality of boost capacitors;
and further comprising:
decoder and clocking logic having a plurality of outputs, each coupled to an input of one of the plurality of boost drivers, having a clock input coupled to receive a boost clock signal, and having a digital input coupled to receive a calibration signal.

5. The converter circuit of claim 4, further comprising:
calibration logic having one or more outputs coupled to the digital input of the decoder and clocking logic, the calibration logic configured to generate the calibration signal responsive to pulses at the first and second outputs of the pulse generator.

6. The converter circuit of claim 1, further comprising:
a plurality of resistors;
a plurality of switches, each switch coupled in series with one of the plurality of resistors across the first and second terminals of the discharge current source, each switch having a control terminal; and
decoder and clocking logic having a plurality of outputs, each coupled to a control terminal of one of the plurality of switches, and having a digital input coupled to receive a calibration signal.

7. The converter circuit of claim 1, wherein the pulse generator comprises:
a first series of inverters having an input coupled to the first terminal of the first integrating capacitor;
and further comprising:
a first plurality of kick-back capacitors;
a first plurality of switches, each coupled in series with one of the first plurality of kick-back capacitors between the first terminal of the first integrating capacitor and an output of one of the first series of inverters of the pulse generator, each switch having a control terminal; and
decoder and clocking logic having a plurality of outputs, each coupled to a control terminal of one of the first plurality of switches, and having a digital input coupled to receive a calibration signal.

8. The converter circuit of claim 7, wherein the pulse generator further comprises:
a second series of inverters having an input coupled to the first terminal of the second integrating capacitor;
and further comprising:
a second plurality of kick-back capacitors; and
a second plurality of switches, each coupled in series with one of the second plurality of kick-back capacitors between the first terminal of the second integrating capacitor and an output of one of the second series of inverters of the pulse generator, each switch having a control terminal;
wherein the decoder and clocking logic has a plurality of outputs, each coupled to a control terminal of one of the second plurality of switches.

9. The converter circuit of claim 1, further comprising:
a first clock transistor having a first terminal coupled to the first terminal of the first integrating capacitor, a second terminal coupled to the first terminal of the first input transistor, and having a gate terminal coupled to receive a first clock signal;
a second clock transistor having a first terminal coupled to the first terminal of the second integrating capacitor, a second terminal coupled to the first terminal of the second input transistor, and having a gate terminal coupled to receive the first clock signal;
a third clock transistor having first and second terminals coupled in series with the first current source between the first terminals of the first and second input transistors and the common potential, and having a gate terminal coupled to receive a second clock signal;
clock circuitry for generating the first and second clock signals and the reset signal.

10. The converter circuit of claim 9, further comprising:
a fourth clock transistor having a first terminal coupled to the second terminals of the first and second integrating capacitors, a second terminal coupled to the discharge current source, and a gate terminal coupled to receive a third clock signal;
wherein the clock circuitry is also for generating the third clock signal.

11. A method, comprising:
charging a first plate of each of first and second integrating capacitors to a first voltage;
applying a differential voltage across first and second inputs, the first input coupled to a gate terminal of a first transistor coupled between the first plate of the first integrating capacitor and a reference potential, and the second input coupled to a gate terminal of a second transistor coupled between the first plate of the second integrating capacitor and the reference potential;
discharging a second plate of each of the first and second integrating capacitors toward the reference potential; and then generating first and second pulses having a relative delay corresponding to voltages at the first plates of the first and second integrating capacitors; and generating a digital output word corresponding to the relative delay of the first and second pulses.

12. The method of claim 11, further comprising:

during the discharging, applying a boost voltage to a second plate of each of first and second boost capacitors, the first and second boost capacitors each having a first plate coupled to the first plate of the first and second integrating capacitors, respectively.

13. The method of claim 12, wherein the first boost capacitor is one of a first plurality of boost capacitors, each having a first plate coupled to the first plate of the first integrating capacitor;

wherein the second boost capacitor is one of a second plurality of boost capacitors, each having a first plate coupled to the first plate of the second integrating capacitor;

and wherein the applying of a boost voltage applies the boost voltage to one or more selected boost capacitors of each of the first and second pluralities of boost capacitors;

and further comprising:

generating a calibration signal responsive to the relative delay of the first and second pulses; and responsive to the calibration signal, selecting one or more boost capacitors from each of the first and second pluralities of boost capacitors.

14. The method of claim 11, further comprising, during the discharging:

generating a calibration signal responsive to the relative delay of the first and second pulses;

selecting one or more of each of a first and second pluralities of kick-back capacitors responsive to the calibration signal;

coupling the selected ones of the first plurality of kick-back capacitors to the first plate of the first integrating capacitor; and coupling the selected ones of the second plurality of kick-back capacitors to the first plate of the second integrating capacitor.

15. The method of claim 11, wherein the discharging includes discharging the second plate of the first and second integrating capacitors through a discharge current source;

and further comprising:

generating a calibration signal responsive to the relative delay of the first and second pulses; and responsive to the calibration signal, selecting one or more resistors for coupling across first and second terminals of the discharge current source.

16. An analog-to-digital converter, comprising:

a voltage-to-delay converter, comprising:

a first reset transistor having a first terminal coupled to a power supply terminal, and having a gate terminal coupled to receive a reset signal;

a first integrating capacitor having a first terminal coupled to a second terminal of the first reset transistor and having a second terminal;

a second reset transistor having a first terminal coupled to the power supply terminal, and having a gate terminal coupled to receive the reset signal;

a second integrating capacitor having a first terminal coupled to a second terminal of the second reset transistor and having a second terminal;

a first current source having a first terminal coupled to a common potential;

a first input transistor having a first terminal coupled to a second terminal of the first current source, a second terminal coupled to the first terminal of the first integrating capacitor, and a gate terminal coupled to receive a first input voltage;

a second input transistor having a first terminal coupled to the second terminal of the first current source, a second terminal coupled to the first terminal of the second integrating capacitor, and a gate terminal coupled to receive a second input voltage;

a discharge current source having a first terminal coupled to a second terminal of each of the first and second integrating capacitors, and a second terminal coupled to the common potential; and a pulse generator having a first input coupled to the first terminal of the first integrating capacitor, a second input coupled to the first terminal of the second integrating capacitor, and first and second outputs; and a delay-to-digital converter, having first and second inputs coupled to the first and second outputs of the pulse generator, respectively, and having a digital output, the delay to digital converter configured to generate a digital output word corresponding to a relative delay between pulses at the first and second outputs of the pulse generator.

17. The analog-to-digital converter of claim 16, wherein the voltage-to-delay converter further comprises:

a first plurality of boost capacitors, each having a first terminal coupled to the first terminal of the first integrating capacitor, and having a second terminal;

a second plurality of boost capacitors, each having a first terminal coupled to the first terminal of the second integrating capacitor, and having a second terminal;

a plurality of boost drivers, each having an output coupled to the second terminal of one of the first plurality of boost capacitors and one of the second plurality of boost capacitors; and decoder and clocking logic having a plurality of outputs, each coupled to an input of one of the plurality of boost drivers, having a clock input coupled to receive a boost clock signal, and having a digital input coupled to receive a calibration signal.

18. The analog-to-digital converter of claim 16, wherein the voltage-to-delay converter further comprises:

a first boost capacitor having a first terminal coupled to the first terminal of the first integrating capacitor, and having a second terminal;

a second boost capacitor having a first terminal coupled to the first terminal of the second integrating capacitor, and having a second terminal; and a boost driver having an output coupled to the second terminal of each of the first and second boost capacitors.

19. The analog-to-digital converter of claim 18, wherein the voltage-to-delay converter further comprises:

a plurality of resistors;

a plurality of switches, each switch coupled in series with one of the plurality of resistors across the first and second terminals of the discharge current source, each switch having a control terminal; and decoder and clocking logic having a plurality of outputs, each coupled to a control terminal of one of the plurality of switches, and having a digital input coupled to receive a calibration signal.

20. The analog-to-digital converter of claim 16, wherein the pulse generator comprises:

a first series of inverters having an input coupled to the first terminal of the first integrating capacitor; and a second series of inverters having an input coupled to the first terminal of the second integrating capacitor;

and wherein the voltage-to-delay converter further comprises:

a first plurality of kick-back capacitors;

a first plurality of switches, each coupled in series with one of the first plurality of kick-back capacitors between the first terminal of the first integrating capacitor and an output of one of the first series of inverters of the pulse generator, each switch having a control terminal; and a second plurality of kick-back capacitors; and a second plurality of switches, each coupled in series with one of the second plurality of kick-back capacitors between the first terminal of the second integrating capacitor and an output of one of the second series of inverters of the pulse generator, each switch having a control terminal;

decoder and clocking logic having a plurality of outputs, each coupled to a control terminal of one of the first and second pluralities of switches, and having a digital input coupled to receive a calibration signal.

* * * * *